United States Patent
Yamakoshi et al.

(10) Patent No.: US 6,456,010 B2
(45) Date of Patent: Sep. 24, 2002

(54) DISCHARGE PLASMA GENERATING METHOD, DISCHARGE PLASMA GENERATING APPARATUS, SEMICONDUCTOR DEVICE FABRICATION METHOD, AND SEMICONDUCTOR DEVICE FABRICATION APPARATUS

(75) Inventors: Hideo Yamakoshi, Yokohama (JP); Koji Satake, Yokohama (JP); Yoshiaki Takeuchi, Nagasaki (JP); Hiroshi Mashima, Nagasaki (JP); Tatsufumi Aoi, Nagasaki (JP); Masayoshi Murata, Nagasaki (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 72 days.

(21) Appl. No.: 09/756,651

(22) Filed: Jan. 10, 2001

(30) Foreign Application Priority Data

Mar. 13, 2000 (JP) ......................................... 2000-069044
Mar. 24, 2000 (JP) ......................................... 2000-085281

(51) Int. Cl.⁷ ................................................. H01J 7/24
(52) U.S. Cl. ............................. 315/111.21; 315/111.71; 313/231.31
(58) Field of Search ....................... 315/111.01, 111.21, 315/111.31, 111.71, 111.91; 118/723 R, 723 E; 313/231.31

(56) References Cited

U.S. PATENT DOCUMENTS

| | | | | |
|---|---|---|---|---|
| 5,665,166 A | * | 9/1997 | Deguchi et al. | 118/723 E |
| 6,211,622 B1 | * | 4/2001 | Ryoji et al. | 315/111.21 |
| 6,313,583 B1 | * | 11/2001 | Arita et al. | 315/111.21 |

FOREIGN PATENT DOCUMENTS

| | | |
|---|---|---|
| JP | 57-131374 | 8/1982 |
| JP | 5-156451 | 6/1993 |
| JP | 5-275194 | 10/1993 |
| JP | 6-342764 | 12/1994 |
| JP | 7-14769 | 1/1995 |
| JP | 7-142400 | 6/1995 |
| JP | 8-236294 | 9/1996 |
| JP | 8-325759 | 12/1996 |
| JP | 10-326698 | 12/1998 |
| JP | 11-111622 | 4/1999 |
| JP | 11-340150 | 12/1999 |
| JP | 2000-164520 | 6/2000 |

OTHER PUBLICATIONS

Mat. Res. Soc. Symp. Proc., vol. 424, pp. 9–19; 1997.
Plasma Sources Sci. Technol. 6, pp. 170–178, 1997.
Mat. Res. Soc. Symp. Proc. vol. 377, pp. 27–32, 1995.
Plasma Technology, 4, pp. 395–411, Elsevier Science B.V., 1999.
Discharge Research No. 138, pp. 27–36, 1992.
Extended Abstract of 4th International Conference on Reactive Plasmas, SR. 1.04, pp. 415–416, 1998.
J. Appl. Phys. 54(8), pp. 4367–4373, 1983 American Institute of Physics.

* cited by examiner

Primary Examiner—Don Wong
Assistant Examiner—Jimmy T. Vu
(74) Attorney, Agent, or Firm—Armstrong, Westerman & Hattori, LLP

(57) ABSTRACT

A discharge plasma generating method includes (a) opposing a discharge electrode having a substantially plane discharge portion to a substrate to be processed in a vacuum reaction vessel such that the discharge electrode and the substrate are substantially parallel to each other, (b) evacuating the vacuum reaction vessel and supplying a process gas to a space between the discharge electrode and the substrate, and (c) applying HF power to the discharge electrode such that an envelope representing the spatial distribution of a HF voltage $\phi$ on the discharge electrode in a split second changes in accordance with a function including time as a parameter, thereby generating a discharge plasma of the process gas between the discharge electrode and the substrate, with substantially no standing wave of the HF voltage $\phi$ generated on the discharge electrode.

58 Claims, 24 Drawing Sheets

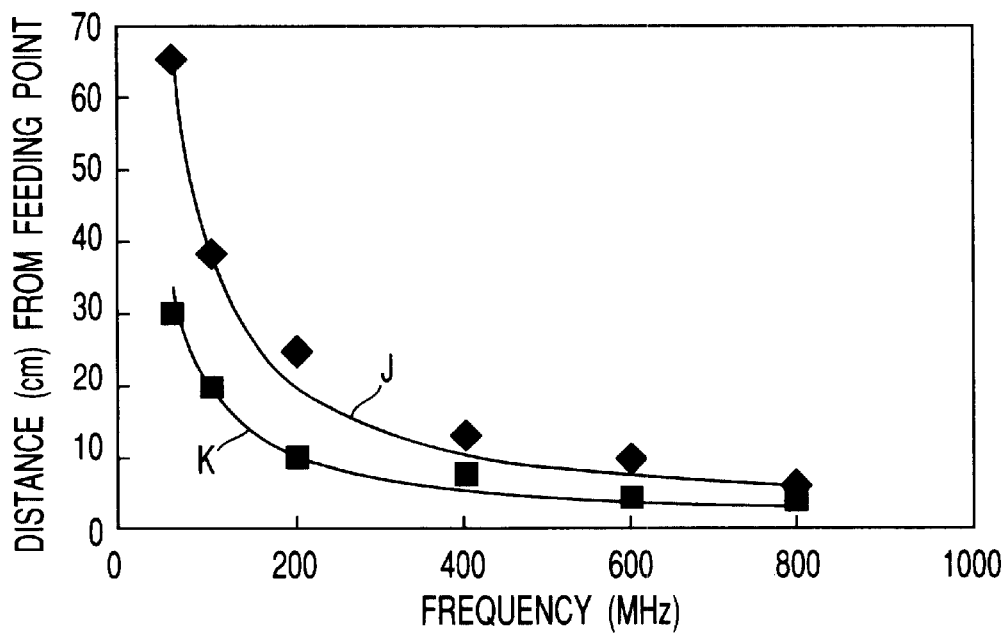
F I G. 12
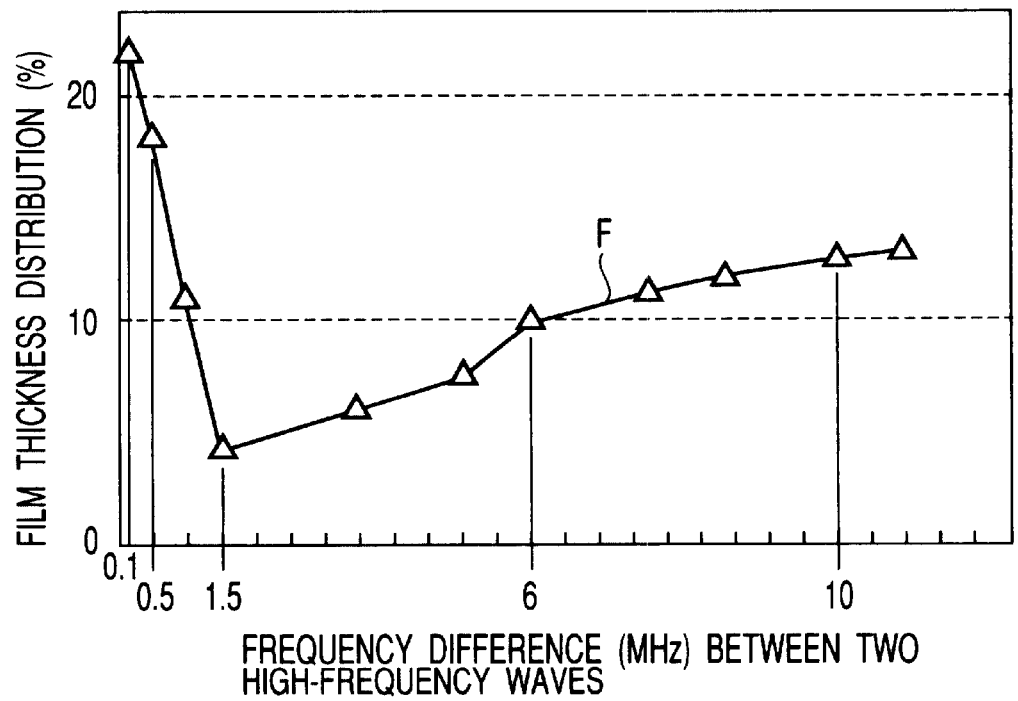
F I G. 13

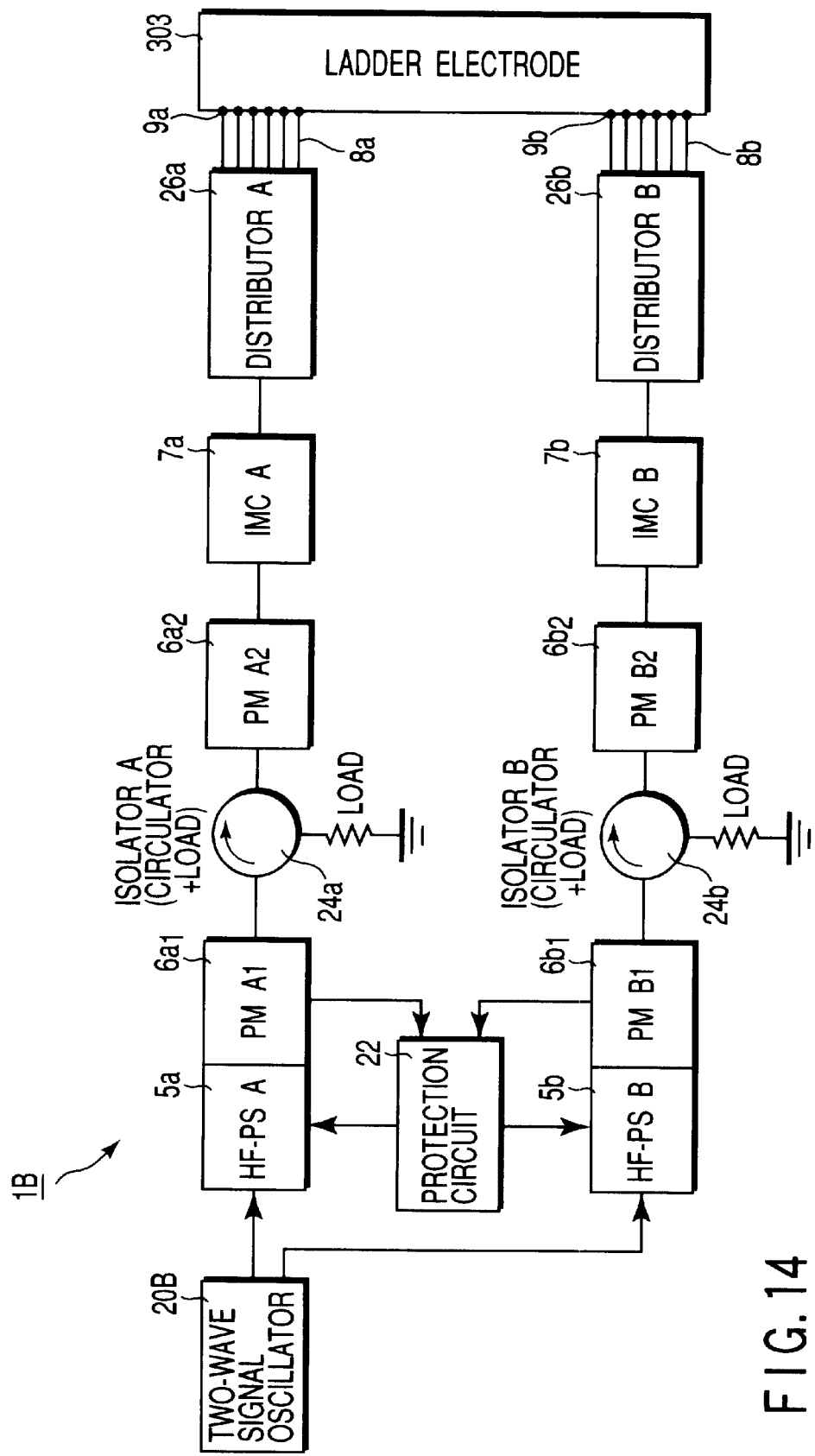
F I G. 14

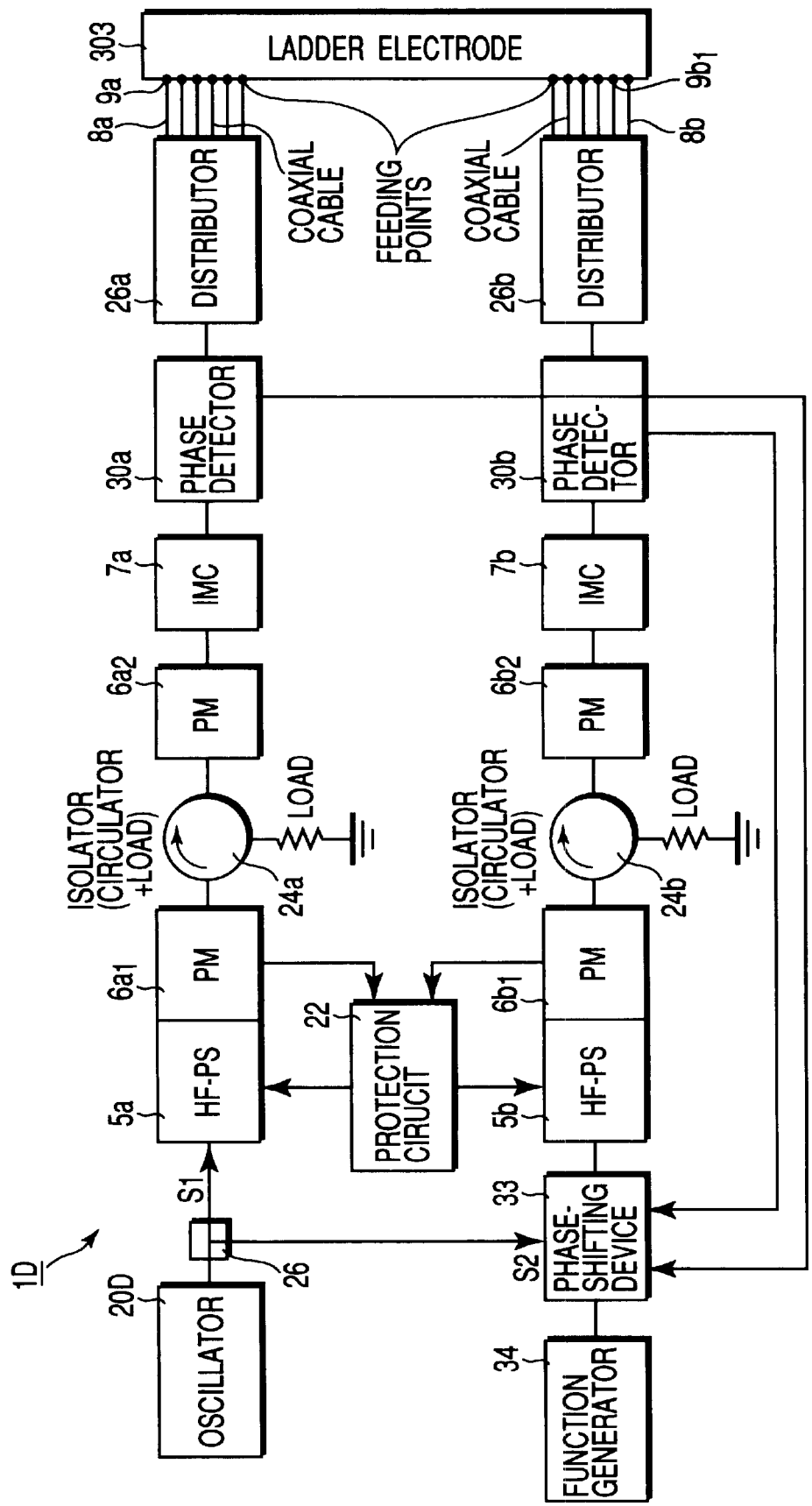
F I G. 21

DISCHARGE PLASMA GENERATING METHOD, DISCHARGE PLASMA GENERATING APPARATUS, SEMICONDUCTOR DEVICE FABRICATION METHOD, AND SEMICONDUCTOR DEVICE FABRICATION APPARATUS

CROSS-REFERENCE TO RELATED APPLICATIONS

This application is based upon and claims the benefit of priority from the prior Japanese Patent Applications No. 2000-069044, filed Mar. 13, 2000; and No. 2000-085281, filed Mar. 24, 2000, the entire contents of which are incorporated herein by reference.

BACKGROUND OF THE INVENTION

The present invention relates to a discharge plasma generating method, discharge plasma generating apparatus, semiconductor device fabrication method, and semiconductor device fabrication apparatus used in the deposition of thin films of semiconductors such as amorphous silicon, nanocrystalline silicon, polycrystalline silicon, and silicon nitride for use in various electronic devices such as an amorphous Si-based solar cell, a thin-film polycrystalline Si-based solar cell, an LCD (liquid crystal display), a thin-film transistor of a flat panel display, a photosensitive body of a copying machine, and an information recording device, or used in the etching of thin films of semiconductor elements.

The surface processing technologies using a discharge plasma of a reactive gas are being more and more demanded to increase the area and processing speed in the fabrication of diverse electronic devices every year. To meet these needs, research and development are recently being extensively made, not only in the industrial world but also in learned societies, particularly for the use of plasma chemical vapor deposition (to be referred to as PCVD hereinafter) and a very-high-frequency (VHF) power supply having a frequency of 30 to 800 MHz.

Apparatuses and methods of generating a discharge plasma of a reactive gas are disclosed in Jpn. Pat. Appln. KOKAI Publication No. 8-325759 (to be referred to as reference 1 hereinafter) and L. Sansonnens et al., "A voltage uniformity study in large-area reactors for RF plasma deposition", Plasma Source Sci. Technol. 6(1997), pp. 170–178 (to be referred to as reference 2 hereinafter).

Unfortunately, the conventional PCVD and plasma etching have the following problems.

(1) The first problem is an increased size of a substrate to be processed. Needs for large-sized solar cells and flat panel display LCDs are increasing. When an amorphous silicon film (to be referred to as an a-Si film hereinafter) is formed on a 50 cm×50 cm substrate by the conventional PCVD method, the film thickness distribution is, e.g., as shown in FIG. 6A. Also, when an a-Si film is formed on a 100 cm×100 cm substrate by the conventional method, the film thickness distribution is, e.g., as shown in FIG. 6B. As shown in FIGS. 6A and 6B, as the frequency of a high-frequency power supply increases, so the film thickness distribution of an a-Si film increases, the film thickness uniformity significantly lowers. In the field of LCDS, a film thickness distribution of ±5% is permitted. In the field of solar cells, a film thickness distribution of a maximum of ±20%, preferably ±10% is permitted. Accordingly, when such large-sized substrates are used in the conventional PCVD method, the only practical power-supply frequency is 13.56 MHz, and no VHFs in a frequency band exceeding this frequency are practical.

(2) The second problem is a method of increasing the surface processing speed (improving the productivity) and improving the film quality. To increase the speed of surface processing, the discharge plasma density must be increased. As a method of increasing the discharge plasma density, the use of a VHF in a frequency band exceeding a versatile power-supply frequency of 13.56 MHz is recommended. Also, to improve the film quality, ion damage to a film must be reduced. To this end, reducing the plasma potential related to the ion energy is effective. The use of a VHF which reduces the plasma potential is also recommended for this purpose.

As examples of needs for a high surface processing speed, low cost (a high film formation speed and a large area) and high quality (a low defect density and high crystallinity) are demanded in the formation of thin films for solar cells and thin-film transistors for flat panel displays. Mat. Res. Soc. Symp. Proc. Vol. 424, p. 9, 1997 (to be referred to as reference 3 hereinafter) disclosed a method of increasing the film formation speed and improving the quality of films by using a VHF power supply. A VHF is recently found to be suited to the high-speed, high-quality formation of particularly a thin nanocrystalline Si film which is attracting attention as a new thin film replacing an a-Si film.

When a VHF is used, however, a VHF progressive wave A1 propagating in the forward direction on an electrode and a VHF reflected wave A2 propagating in the opposite direction interfere with each other as shown in FIG. 2A, generating a standing wave A3 as shown in FIG. 2B. This standing wave A3 promotes the spatial nonuniformity of the discharge plasma density, thereby increasing the film thickness distribution of a thin film formed on a substrate 804. This is contrary to the need described in item (1) above.

Other causes which promote the film thickness nonuniformity resulting from this standing wave are as follows.

(a) The first cause is an increase and nonuniformity of the impedance of a propagation path resulting from the skin effect. When a VHF is supplied from a power supply 807 to an electrode 802 via feeding point (feeder distribution center) 809, 809a, and 809b as shown in FIGS. 1A and 1B, the skin effect causes this VHF to propagate, along the surface portion of the electrode 802, as the progressive wave A1 in one direction and the progressive wave A2 in the other direction on the electrode surface as shown in FIG. 2A. This interference generates the standing wave as shown in FIG. 2B. This skin effect appears more notably for a VHF than for a versatile frequency of 13.56 MHz as a high frequency. A surface depth δ at which a current flows by this skin effect is given by $$\delta = (3.14 \times f \cdot \mu \cdot \sigma)^{-0.5}$$

where f is the frequency, $\mu$ is the permeability, and a is the conductivity.

When the electrode 802 is copper, for example, its surface depth is about 19 $\mu$m for a frequency of 13.56 MHz as a high frequency, about 10 $\mu$m for a VHF of 50 to 60 MHz, and about 5.8 $\mu$m for a VHF of 150 MHz. Therefore, in PCVD or plasma etching using a VHF, the impedance of a power-supply propagation path from a power supply to a discharge portion of a discharge electrode increases. This increases the impedance and makes voltage distribution nonuniform. Accordingly, the spatial uniformity of the discharge plasma density cannot be held any longer.

(b) The second cause is mutual interference between a plasma and VHF. When a VHF becomes nonuniform as described above, the plasma distribution becomes nonuniform accordingly, thereby producing a load distribution (the impedance lowers as the plasma density rises) to an electrode. This influences the VHF distribution.

As described above, the discharge plasma density becomes nonuniform owing to the generation of a standing wave by a reflected wave from the electrode end, the influence which the presence of the electrode impedance has on the voltage distribution, and the mutual interference between a plasma and VHF. Consequently, the film thickness uniformity suffers in large-area PCVD using a VHF.

For example, when the dimensions of a parallel plate electrode exceed 30 cm×30 cm or the VHF frequency exceeds 30 MHz, the influence of the standing wave A3 becomes conspicuous. This makes it difficult to achieve the minimum necessary film thickness uniformity of semiconductor devices.

FIG. 3 is a graph showing a voltage distribution and an ion saturation current distribution by plotting the position (cm) on a discharge electrode on the abscissa and a voltage vpp (V) and ion saturation current on the ordinate. This data is obtained by the conventional method which uses a VHF of 100 MHz. Referring to FIG. 3, a characteristic curve B1 indicates the voltage distribution, and a characteristic curve B2 indicates the ion saturation current distribution. This ion saturation current distribution (B2) is substantially equal to the electron density distribution and can be easily measured. Hence, the ion saturation current distribution is generally used as an index of the discharge plasma density distribution. The voltage distribution (B1) shows that the standing wave A3 is generated on the electrode and the ion saturation current distribution, i.e., the plasma distribution becomes nonuniform accordingly.

On the other hand, in Jpn. Pat. Appln. KOKAI Publication No. 11-111622 (a four-point feeding method: to be referred to as reference 4 hereinafter), the generation of the voltage distribution caused by the standing wave A3 is suppressed by feeding power to four different portions of a ladder electrode. A ladder electrode is formed by assembling a plurality of parallel longitudinal electrode rods 304 and one or more pairs of parallel lateral electrode rods into the form of a lattice. This ladder electrode is assumed to be more uniform than a common parallel plate electrode. In the method of reference 4, the standing wave generation suppressing means as described above is added to this ladder electrode. However, if the electrode dimensions exceed 30 cm×30 cm or the power-supply frequency exceeds 80 MHz, the effect of preventing the generation of a voltage distribution is substantially lost. This makes it difficult to form a film having a uniform thickness on a large-area substrate.

FIG. 4 is a graph showing voltage distributions by plotting the position (cm) on a ladder electrode on the abscissa and the voltage Vpp (V) on the ordinate. This data shows voltage distributions generated in a certain electrode rod on the ladder electrode when power is fed via four points by the conventional method by using VHFs of 60 and 100 MHz. Referring to FIG. 4, a characteristic curve C1 indicates data obtained when a VHF of 60 MHz is used, and a characteristic curve C2 indicates data obtained when a VHF of 100 MHz is used. Although a relatively uniform voltage distribution is obtained at a frequency of 60 MHz (the characteristic curve C1), a nonuniform voltage distribution is obtained at a frequency of 100 MHz (the characteristic curve C2). Also, in the method of this reference 4, optimum positions of the four feeding points must be found by trial and error, and this requires much labor and time. Furthermore, if the film formation conditions such as the gas pressure and high-frequency power change, the optimum positions of the feeding points also change.

The above problems are also noted in learned societies. Mat. Res. Soc. Symp. Proc. Vol. 377, p. 27, 1995 (to be referred to as reference 5 hereinafter) has proposed a method in which a lossless reactance (coil) is connected to the side away from the feeding side of a parallel plate electrode. In the method of this reference 5, the conditions of reflection of a progressive wave from the electrode end are changed to generate a portion in which the distribution is relatively flat in the waveform of the standing wave A3, e.g., an antinode portion (a portion near the peak of a sine wave) on the electrode, thereby decreasing the voltage distribution in the electrode. However, the method of reference 5 does not do away with the standing wave 3 all together but merely generates a flat portion of a sine wave on the electrode. Therefore, a uniform portion is obtained up to at most about ⅛ the wavelength (0.6 m for 60 MHz, and 0.4 m for 100 MHz). Uniformization within a range exceeding this is in principle impossible. The standing wave A3 shown in FIG. 2B has four nodes and four antinodes. A standing wave like this cannot be uniformized. The method is effective only in a case as indicated by B1 in FIG. 3, in which the length is equal to or smaller than a pair of one node and one antinode.

FIG. 5 is a graph showing a voltage distribution by plotting the position (cm) on a ladder electrode on the abscissa and the voltage Vpp (V) on the ordinate. Referring to FIG. 5, a characteristic curve D indicates data showing a voltage distribution when one end of a parallel plate electrode is terminated by a lossless reactance (coil) at a VHF of 100 MHz. As shown in FIG. 5, the voltage in a region from the end of the electrode to about 30 cm can be made substantially uniform. However, the voltage becomes nonuniform in a region larger than this, so this region cannot be used in film formation.

As described above, when a VHF is used in the conventional PCVD method, it is impossible to generate a uniform discharge plasma in a large area and perform uniform processing if a very large substrate exceeding 1 m×1 m is processed at 60 MHz or if a 30 cm×30 cm substrate is processed at a frequency exceeding 80 MHz.

M. Noisan, J. Pelletier, ed., "Microwave Excited Plasmas", Technology, 4, second impression, p. 401, Elsevier Science B.V., 1999 (to be referred to as reference 6 hereinafter) disclosed a technique which supplies two different high-frequency waves to two discharge electrodes. This technique of reference 6 uses one high-frequency wave to generate a discharge plasma and the other high-frequency wave to control the surface bias voltage of a substrate, thereby controlling the amount of active ions flowing into the substrate and the amount of energy incident on the substrate. That is, the purpose of this technique is not to uniformize a plasma when a large-size substrate exceeding 1 m×1 m is processed.

BRIEF SUMMARY OF THE INVENTION

It is an object of the present invention to provide a discharge plasma generating method, discharge plasma generating apparatus, semiconductor device fabrication method, and semiconductor device fabrication apparatus which can generate a uniform discharge plasma in a large area by using a very high frequency (VHF) and can uniformly process a large substrate.

The first subject of the present invention is to eliminate the generation of a standing wave on an electrode in principle and uniformize the voltage distribution on the electrode while a plasma is generated, thereby improving the uniformity (in-plane uniformity) of the film formation rate or etching rate on the surface of a substrate. As described earlier, it is very difficult for the conventional method to make the voltage distribution uniform if the electrode size exceeds ⅛ of a high-frequency wavelength. For example, when a high frequency of 60 MHz is applied to an electrode having dimensions exceeding 1 m×1 m, a standing wave significantly appears to make the voltage distribution extremely nonuniform. Also, when a VHF exceeding 80 MHz is applied to a 30 cm×30 cm electrode, a standing wave significantly appears to make the voltage distribution very nonuniform.

The plasma density becomes nonuniform at a VHF probably by ① the generation of a standing wave on an electrode, ② the influence of the presence of floating impedance on the voltage distribution, and ③ the mutual interference between a plasma and high-frequency wave. The present inventors made extensive studies on these problems and have found that ① the generation of a standing wave on an electrode is the main cause. On the basis of this knowledge, the present inventors have completed the present invention.

The present invention will be simply described below for the sake of easy understanding.

Assume that a phenomenon on two-dimensional electrode is simplified to a phenomenon on one-dimensional electrode and two frequencies are supplied from the two ends of one rod electrode (corresponding to one electrode rod of a ladder electrode). Assume also that the attenuation of the two high-frequency waves is neglected and the reflection at the electrode end is negligibly small. Under the simplified conditions, the high-frequency waves (voltages ($\phi$(V))) supplied from the two ends of the rod electrode are given by $$\phi_1 = \cos(\omega_1 t - k_1 z + \theta_1) \quad (1)$$

$$\phi_2 = \cos(\omega_2 t - k_2 z + \theta_2) \quad (2)$$

where $\omega$, $k$, $t$, $z$, and $\theta$ are the angular frequency (rad/sec), wave number (rad/m), time (sec), position (m), and phase angle (rad), respectively, of each wave.

The wave number $k$ is represented using a phase velocity $v$ (m/sec) and the angular frequency $\omega$ by $$k_1 = \omega_1/v_1, \; k_2 = \omega_2/v_2 \quad (3)$$

A high-frequency voltage $\phi$ at each time in each point (portion) on the electrode is given as the sum of equations (1) and (2) by as follows:

$$\phi = \phi_1 + \phi_2 = \cos(\omega_1 t - k_1 z + \theta_1) + \cos(\omega_2 t - k_2 z + \theta_2) = 2\cos(\omega_{ave} t - k_{mod} z + \theta_{ave}) \cdot \cos(\omega_{mod} t - k_{ave} z + \theta_{mod}) \quad (4)$$

The individual components in the equation are as follows:

$$\omega_{ave} = (\omega_1 + \omega_2)/2, \; \omega_{mod} = (\omega_1 - \omega_2)/2,$$

$$k_{ave} = (k_1 + k_2)/2, \; k_{mod} = (k_1 - k_2)/2,$$

$$\theta_{ave} = (\theta_1 + \theta_2)/2, \; \theta_{mod} = (\theta_1 - \theta_2)/2,$$

In equation (4) above, the term $\cos(\omega_{ave} t - k_{mod} z + \theta_{ave})$ corresponds to a carrier wave, and the term $\cos(\omega_{mod} t - k_{ave} z + \theta_{mod})$ corresponds to an envelope.

An "envelope" is a curve formed by tracing and jointing the peaks of a modulated high-frequency wave. More specifically, when a high-frequency wave $\phi_1$ shown in FIG. 7A and a high-frequency wave $\phi_2$ shown in FIG. 7B are synthesized, a synthetic wave $\phi$ shown in FIG. 7C results. This synthetic wave $\phi$ is represented by equation (4) above, and its component $\cos(\omega_{mod} t - k_{ave} z + \theta_{mod})$ is the envelope.

First, assume that $\omega_1 = \omega_2$ and $\theta_{mod}$ is constant with time ($\theta_{mod}(t) = \text{const.}$), i.e., assume that high-frequency waves having the same frequency and a phase difference which does not change with time are supplied from the two ends. This is equivalent to supplying high-frequency $\omega_1$ power by dividing it into two portions from a single power supply or to operating a plurality of high-frequency power supplies in synchronism with each other by a high frequency from a single oscillator and supplying their outputs. That is, this case corresponds to the conventional method. When this is the case, the high-frequency voltage $\phi$ on the electrode is represented by $$\phi = 2\cos(\omega_1 t + \theta_{ave}) \cdot \cos(-\omega_1/v_1 \cdot z + \theta_{mod}) \quad (5)$$

This equation (5) shows that a high frequency having a carrier wave $\cos(\omega_1 t + \theta_{ave})$ with the angular frequency $\omega_1$ and an envelope $\cos(-\omega_1/v_1 \cdot z + \theta_{mod})$ exist on the electrode. The carrier wave dominates a temporal change in the voltage at a certain point, and the envelope dominates the spatial distribution of the voltage. Since $\omega_1 = \omega_2$ and $\theta_{mod}(t) = \text{const}$, the envelope $\cos(-\omega_1/v_1 \cdot z + \theta_{mod})$ does not change with time and as a consequence becomes a standing wave.

This can be simply explained as follows.

FIG. 2A is a graph for explaining a standing wave generated when the two output high frequencies from a two-output phase-variable high-frequency oscillator are supplied to an electrode while the phase difference between the frequencies is held at a constant value ($\theta_{mod}(t) = \text{const}$). Referring to FIG. 2A, the waveform of a high frequency A1 indicates a progressive wave of the first power, which is represented by equation (1), and a high frequency A2 indicates a progressive wave of the second power, which is represented by equation (2). FIG. 2B is a graph showing the power distribution of a standing wave by plotting the position on the electrode surface on the abscissa and the square of the envelope term $\cos(-\omega_1/v_1 \cdot z + \text{const.})$ of equation (5) on the ordinate. When the phase difference between the two output high-frequency power components is fixed to a constant value ($\theta_{mod}(t) = \text{const}$, e.g., 0°), these power components are synthesized to form a standing wave as shown in FIG. 2B. This standing wave is the cause of a spatial voltage distribution, i.e., a plasma distribution, and a film deposition distribution in the conventional feeding method.

On the other hand, if the envelope does not stay as a standing wave but moves with time, the generation of a standing wave is suppressed. This is the gist of the present invention. Two examples will be presented below.

(a) When $\omega_1 \neq \omega_2$ (a method of supplying high-frequency waves of different frequencies)

When two frequencies are different ($\omega_1 \neq \omega_2$), a high-frequency voltage $\phi$ at each point at each time is calculated by $$\phi = 2\cos(\omega_{ave} t - k_{mod} z + \theta_{ave}) \cdot \cos(\omega_{mod} t - k_{ave} z + \theta_{mod}) \quad (6)$$

From equation (6) above, this high-frequency voltage $\phi$ contains a carrier wave $\cos(\omega_{ave} t - k_{mod} z + \theta_{ave})$ having an angular frequency $\omega_{ave}$ and an envelope $\cos(\omega_{mod} t - k_{ave} z + \theta_{mod})$ having an angular frequency $\omega_{mod}$ which is generally called "beat" or "hum". Since the envelope includes a term $\omega_{mod} t$ which changes with time, this envelope moves with the passing of time, so no standing wave is generated. This is the first best mode of the present invention.

(b) When $\omega_1 = \omega_2$ and $\theta_{mod}(t) \neq \text{const.}$ (a method of supplying high-frequency waves having the same frequency by temporally changing the phase difference)

When frequencies are the same ($\omega_1=\omega_2$) and the phase difference $\theta_{mod}$ changes in a split second(at all times) ($\theta_{mod}(t)\neq$const.), a high-frequency voltage $\phi$ at each point at each time is calculated by $$\phi=2\cos(\omega_1 t+\theta_{ave})\cos(-\omega_1/v_1 \cdot z+\theta_{mod}(t)) \quad (7)$$

In equation (7) above, the envelope is $\cos(-\omega_1/v_1 \cdot z+\theta_{mod}(t))$, i.e., includes a term $\theta_{mod}(t)$ which changes with time. Accordingly, this envelope moves with the passing of time, and no standing wave is generated. This is the second best mode of the present invention.

When the envelope is in a split second (at all times) changed as indicated by items (a) and (b) above, no standing wave is generated on an electrode, so a uniform plasma can be generated.

Note that the conditions of $\omega_1\neq\omega_2$ (the method of supplying high-frequency waves of different frequencies) and $\omega_1=\omega_2$ and $\theta_{mod}(t)\neq$const. (the method of supplying high-frequency waves having the same frequency by changing the phase difference) need not be intentionally made. These conditions can be simply realized by the use of two independent high-frequency oscillators. That is, even two high-frequency oscillators set to oscillate the same VHF, e.g., 100 MHz have characteristics unique to the individual oscillators. Hence, actual oscillation frequencies slightly deviate from the set frequency (100 MHz). For example, the first oscillation frequency is 100.001 MHz and the second oscillation frequency is 100.003 MHz, i.e., $\omega_1\neq\omega_2$ holds in a strict sense. Also, frequencies change with temperature variation and the like, so the relationships between frequencies and between phases change at random. Therefore, when a plurality of independent high-frequency oscillators are used, the envelope moves with time, and no standing wave is generated.

Another method of changing the envelope is to change frequency with time (FM modulation: frequency modulation), perform chirp (frequency chirp), or change an amplitude with time (AM modulation: amplitude modulation).

In the formation of a large-area uniform film performed by a plasma by using a high-frequency wave on the basis of this principle, even when the electrode size exceeds ⅛ of the high-frequency wavelength, in which case uniformization is conventionally very difficult, i.e., even for an apparatus for processing a very large substrate exceeding 1 m×1 m at a high frequency of, e.g., 60 MHz, the present invention provides a method of feeding power to a discharge electrode, by which a high frequency is supplied to the electrode such that the envelope function of a high-frequency voltage $\phi$ on the electrode temporally changes, thereby performing high-speed, high-quality film formation as the characteristic of a high-frequency wave and at the same time generating a uniform plasma and forming a uniform film by suppressing the generation of a standing wave on the electrode.

This temporal change of the envelope function is realized by the use of a plurality of high-frequency power supplies.

First, case (a) in which $\omega_1\neq\omega_2$ (the method of supplying high-frequency waves having different frequencies) will be explained.

As practical means of supplying two frequencies ($\omega_1\neq\omega_2$) to an electrode, two independent high-frequency power supplies are used. For example, in two power supplies (containing high-frequency oscillators) having a rated frequency of 60 MHz, each oscillator has an oscillation frequency unique to the oscillator. In practice, therefore, a frequency difference of about a few hundred kHz exists between the two oscillators. This difference between the inherent oscillation frequencies allows $\omega_1\neq\omega_2$ to hold in practice.

Alternatively, to avoid the contingency as described above, a plurality of power supplies having two oscillation frequencies positively made different from each other are used.

If the difference between the frequencies of these high-frequency power supplies is made too large and one frequency largely deviates from an optimum frequency, the properties of film formation and etching significantly lower from the properties of the optimum frequency. To prevent this, the frequency difference is set to 20% or less.

Case (b) described above in which $\omega_1=\omega_2$ and $\theta_{mod}(t)\neq$const. (the method of supplying high-frequency waves having the same frequency by temporally changing the phase difference) will be explained below.

In this method, power is fed to a discharge electrode via a plurality of feeding points, and the difference between a phase to one feeder distribution center and at least one phase to another is temporally changed. It is more preferable to use a phase shifter as a means for temporally changing the phase difference. This phase shifter is preferably inserted between an oscillator for determining the oscillation frequency of high-frequency power and an amplifier for amplifying the signal to necessary power.

To suppress a standing wave by using a plurality of power supplies, the one-dimensional modeling mentioned earlier must apply. As one practical condition, a plurality of feeding points of a discharge electrode are desirably arranged in symmetrical positions.

Also, when independent power supplies are used, the difference between VHFs does not stabilize to raise the problem of reproducibility in some cases. Therefore, it is desirable to ensure reproducibility by controlling the VHF difference to a constant value.

Furthermore, an isolator is preferably inserted between an impedance matching circuit and a power supply. This isolator reduces input power to the power supply from another power supply and thereby protects this power supply. The impedance matching circuit matches the impedances of a discharge electrode and the power supply.

The frequency band width of a practical isolator is about 4% for a high-frequency power of 1 kW or less and about 1% for a high-frequency power of about 2 kW. To build a system within this range, therefore, the difference between the frequencies of a plurality of high-frequency power supplies is preferably 4% or less, and more preferably, 1% or less of the average frequency.

Also, in accordance with the magnitude of input high-frequency power to each power supply from the discharge electrode side, the output from another power supply is restricted to reduce input power from this power supply. This prevents a VHF having a different frequency and/or phase from entering the former power supply and thereby prevents damage to the power supply.

To suppress a standing wave by using a plurality of power supplies, high-frequency waves having a plurality of frequencies are supplied from one feeder distribution center. This allows building a system more inexpensively than when the high-frequency waves are supplied from different feeding points. For this purpose, high-frequency power components from a plurality of high-frequency power supplies are mixed by a high-frequency mixer and supplied to a discharge electrode.

As a means for temporally changing the envelope function, different from the method using two frequencies or a temporally changing phase difference, it is possible to temporally change the voltage amplitude of high-frequency power (AM modulation), temporally change the frequency of high-frequency power (FM modulation), or perform frequency chirp.

It is favorable to previously measure at least one of a voltage distribution, plasma generation density distribution, radical generation density distribution, film formation distribution, etching distribution, and semiconductor film characteristic distribution with respect to the difference between a plurality of frequencies, the value of each frequency, the difference between phases, or the range of AM modulation, FM modulation, or frequency chirp, and obtain a necessary uniform distribution on the basis of the measurement result by using time average or time integral by adjusting at least one of the time, period, and frequency of power supply with respect to the difference between the specific frequencies, the value of each frequency, the difference between phases, or the range of AM modulation, FM modulation, or frequency chirp.

Since the envelope distribution of this system changes with time, nodes and antinodes move to turn on/off a plasma. This should not have any influence on the speed and quality of processing by the plasma as an object. Hence, the plasma must keep being ON in a pseudo manner. For this purpose, the cycle of plasma ON/OFF resulting from temporal change in the envelope distribution, i.e., a cycle equivalent to the reciprocal of the difference between the frequencies of a plurality of high-frequency power components, a cycle for changing the phase, or the cycle of AM modulation, FM modulation, or frequency chirp is made shorter than, preferably ½ or less the extinction life of an active atom, active molecule, or ion in a discharge plasma. This prevents the discharge plasma from uselessly repeating ON/OFF, so the speed and quality of processing are not influenced.

To keep the plasma ON state in a pseudo manner, the above cycle is determined as follows when a thin silicon film is to be formed by using silane.

Let $\tau$ denote the life of an $SiH_3$ active molecule calculated by $$\tau \approx (\Delta x)^2/(2D) \tag{8}$$

where D is a diffusion coefficient ($D=2.5\times10^3$ ($cm^2s^{-1}$)), and $\Delta x$ is the distance (cm) from an electrode to a substrate.

The cycle described above is made shorter than one or both of the life $\tau$ and the life of $1.1\times10^{-4}$ sec of a hydrogen atom radical. More specifically, the cycle is preferably ½ or less the life $\tau$ or the life of $1.1\times10^{-4}$ of a hydrogen atom radical.

On the other hand, for an application in which active atoms, active molecules, or ions in a plasma start to be generated in an OFF time after the plasma is generated, e.g., for an application to etching, it is possible to delay the cycle to intentionally form a plasma OFF time to hold an enough OFF time to generate active atoms, active molecules, or ions in the plasma, turn on the next plasma before the active atoms, active molecules, or ions in the former plasma reduce, and turn off the latter plasma, thereby efficiently generating the active atoms, active molecules, or ions. To this end, the cycle of plasma ON/OFF caused by a temporal change in the envelope distribution is made longer than and 10 times or less, preferably 2 to 4 times the generation life of active atoms, active molecules, or ions in a plasma to be generated by the discharge electrode.

Also, the particle generation amount is reduced by setting the cycle to 1 sec or less, preferably 1 msec or less.

Alternatively, the particle generation amount is reduced by making the cycle longer than, preferably twice or more a discharge region dwell time t of a source gas calculated by $$t \approx (S \cdot \Delta x)/Q \tag{9}$$

where S is the substrate area ($cm^2$)

$\Delta x$ is the distance (cm) from the discharge electrode to the substrate

Q is the volume flow rate ($cm^3/sec$)

One desirable practical condition by which the one-dimensional modeling described above simply applies is that the discharge electrode is a ladder electrode or a mesh electrode.

Furthermore, to supply to a substrate electrode high-frequency power which is one of two frequencies for maintaining uniformity and which adjusts the energy of ions incident on the substrate, high-frequency power components are supplied from two or more high-frequency power supplies to each of a discharge electrode having a substrate and a discharge electrode having no substrate.

The discharge electrode preferably has dimensions of 500×500 mm or more, more preferably in the range of 500×500 mm to 2,200×2,200 mm, and most preferably in the range of 500×500 mm to 1,600 to 1,600 mm.

A substrate to be processed can be made of a glass, metal, or resin material. When the substrate is made of glass, the substrate is preferably heated to the temperature of range between 80° C. and 350° C. in plasma processing. Examples of the glass include soda-lime glass and silica glass. When the substrate is made of a metal, the substrate is preferably heated to the temperature of range between 80° C. and 500° C. in plasma processing. Examples of the metal include various kinds of stainless steel, aluminum, and an aluminum alloy. When the substrate is made of a resin, the substrate is preferably heated to the temperature of range between 80° C. and 200° C. in plasma processing. Examples of the resin include polyimide and polyethylene terephthalate (PET).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 12 is a graph showing the correlation between a high frequency and the distance from a feeder distribution center before the high frequency attenuates to a certain value;

FIG. 13 is a graph showing the correlation between the difference between two high frequencies and a film thickness distribution (a film thickness variation);

FIG. 14 is a plan block diagram showing a discharge plasma generating apparatus according to the second embodiment (or the 13th embodiment) of the present invention;

FIG. 21 is a plan block diagram showing a discharge plasma generating apparatus according to the fourth embodiment of the present invention;

DETAILED DESCRIPTION OF THE INVENTION

Various preferred embodiments of the present invention will be described below with reference to the accompanying drawings.

First Embodiment

Figure 8:
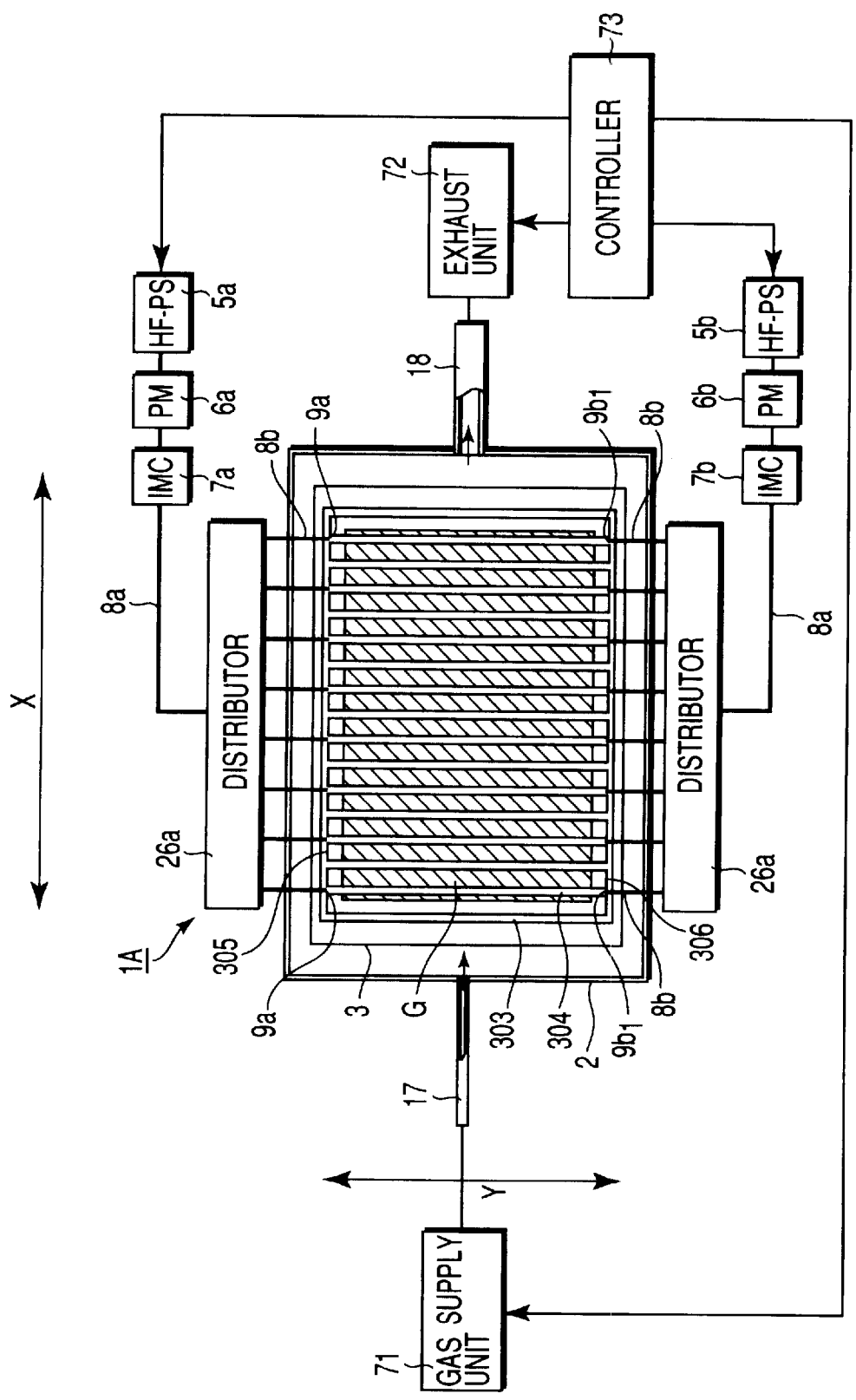
FIG. 8 is a plan block diagram showing a discharge plasma generating apparatus according to the first embodiment of the present invention.

In the first embodiment, a high-frequency plasma CVD apparatus 1A shown in FIG. 8 is used. This apparatus 1A includes a reaction vessel 2, a ladder electrode (a discharge electrode) 303, a ground electrode 3, two high-frequency power supplies 5a and 5b, a gas supply unit 71, an exhaust unit 72, and a controller 73. The reaction vessel 2 is made airtight, and a gas supply pipe 17 and an exhaust pipe 18 open in appropriate portions of this vessel 2.

The gas supply pipe 17 communicates with the gas supply unit 71. The gas supply unit 71 incorporates a gas supply source and a mass-flow controller. The gas supply source contains process gases which contain film formation components. The process gases are, e.g., an Si-containing gas such as monosilane or disilane and an additive component gas such as hydrogen gas. The power switch of the mass-flow controller is connected to an output portion of the controller 73.

The exhaust pipe 18 communicates with the exhaust unit 72. The exhaust unit 72 houses a vacuum pump and a device for making toxic substances harmless. The power switch of the vacuum pump is connected to the output portion of the controller 73. This vacuum pump can reduce the internal pressure of the reaction vessel 2 to less than about $1 \times 10^{-6}$ Torr.

The ground electrode 3 and the ladder electrode 303 are opposed with a clearance of, e.g., 20 mm between them. The ground electrode 3 includes a mechanism (not shown) for holding a glass substrate G to be processed and contains a heater (not shown) for heating this substrate G. When the dimensions of the substrate G are 2.0 m×1.4 m, the dimensions of the ground electrode 3 are 2.2 m×1.6 m. The gas supply pipe 17 preferably has a plurality of gas inlet ports. These gas inlet ports are desirably formed behind the ladder electrode 303 so as to form laminar flows of the process gases.

The ladder electrode 303 is formed by assembling a plurality of (e.g., 17) parallel longitudinal rods 304 and one or more pairs of parallel lateral rods 305 into the form of a lattice. This ladder electrode 303 is opposed parallel to the substrate G which is held by the ground electrode 3. The longitudinal rods 304 are arrayed at equal pitches in the Y-axis direction, and the lateral rods 305 are arrayed at equal pitches in the X-axis direction. The length in the X-axis direction of the ladder electrode 303 is about 2.2 m, and its length in the Y-axis direction is about 1.6 m.

The ladder electrode 303 has eight first feeding points 9a and eight second feeding points $9b_1$. The first feeding points 9a are formed at nodes between the lateral rods 305 and the longitudinal rods 304 on one side. The second feeding points $9b_1$ are formed at nodes between the lateral rods 305 and the longitudinal rods 304 on the other side. These first and second feeding points 9a and $9b_1$ are formed at substantially equal pitches.

The first feeding points 9a are connected to a first distributor 26a by coaxial cables 8b. To this first distributor 26a, an impedance matching circuit 7a, a power meter 6a, and the first power supply 5a are connected in this order by a coaxial cable 8a. The first power supply 5a contains a high-frequency oscillator whose frequency is set to 60 MHz, and supplies VHF power to the ladder electrode 303 via the eight first feeding points 9a.

The second feeding points $9b_1$ are connected to a second distributor 26b via coaxial cables 8b. To this second distributor 26b, an impedance matching circuit 7b, a power meter 6b, and the second power supply 5b are connected in this order. The second power supply 5b is independent of the first power supply 5a and houses a high-frequency oscillator whose frequency is also set to 60 MHz. This second power supply 5b supplies VHF power to the ladder electrode 303 via the eight second feeding points $9b_1$.

When the actual frequencies of these two power supplies were measured with a high-accuracy spectrum analyzer, the power supplies 5a and 5b output high frequencies of 59.8 MHz and 60.3 MHz, respectively. The actual oscillation frequency usually thus deviates from the set frequency, and this is because different oscillators have different characteristics.

Accordingly, different VHFs of 59.8 MHz and 60.3 Hz are supplied to the ladder electrode 303 from the two power supplies 5a and 5b via the first and second feeding points 9a and $9b_1$ facing each other. In the present invention, the difference (0.5 MHz) between the two VHFs is important.

In this embodiment, the first and second feeding points 9a and $9b_1$ were arranged symmetrically with respect to the central line of the ladder 303, thereby generating a one-dimensional voltage distribution on each of the longitudinal rod 304. This caused a phenomenon (to be described later) which moved an envelope at high speed. Consequently, it was possible to uniformize the longitudinal plasma generation distribution on the longitudinal rods 304 and the plasma generation distribution (a plasma distribution in the X-axis direction) between the longitudinal rods 304.

In this embodiment, the number of each set of feeding points is eight (sixteen in total). However, the plasma generation distribution in the X-axis direction (the longitudinal direction of the electrode) can be further uniformized by increasing the number of feeding points to twelve (twenty four in total) or to sixteen (thirty two in total). The effects of the present invention are of course found even when the number of feeding points is decreased to six (twelve in total), five (ten in total), four (eight in total), three (six in total), two (four in total), and one (two in total).

Also, in this embodiment power components are fed to the different feeding points from the two power supplies. However, the discharge plasma density can be made more uniform by increasing the number of power supplies. For example, the uniformity of the discharge plasma density can be improved by supplying high-frequency power components having different frequencies from four power supplies to different feeding points.

Figure 1A:
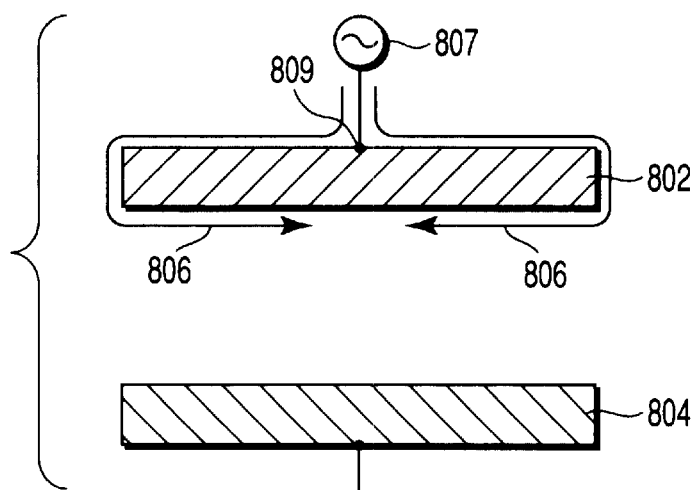
FIG. 1A is a schematic view for explaining the flow of a high-frequency current when power is fed to an electrode by a conventional method.
Figure 1B:
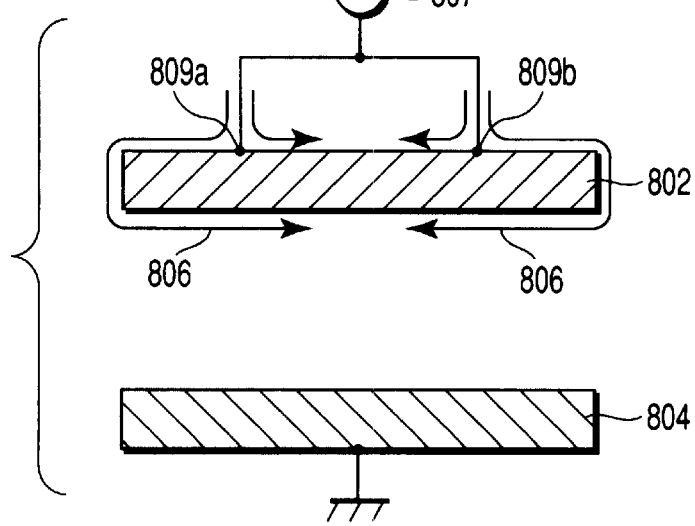
FIG. 1B is a schematic view for explaining the flow of a high-frequency current when power is fed to an electrode by another conventional method.
Figure 2A:
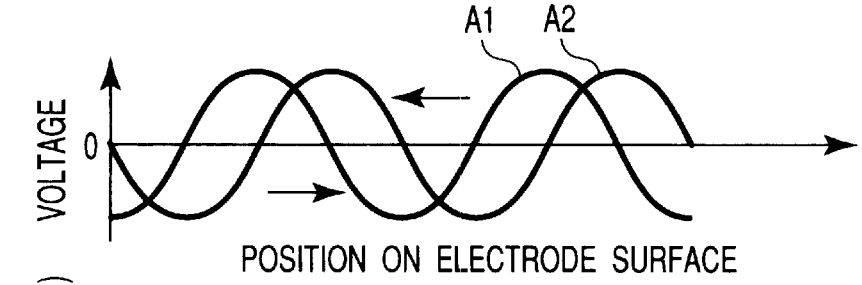
FIGS. 2A and 2B are graphs for explaining a standing wave generated when two output high frequencies from two-output variable-phase high-frequency oscillator are fed with a phase difference of 0° to an electrode by a conventional method.
Figure 2B:
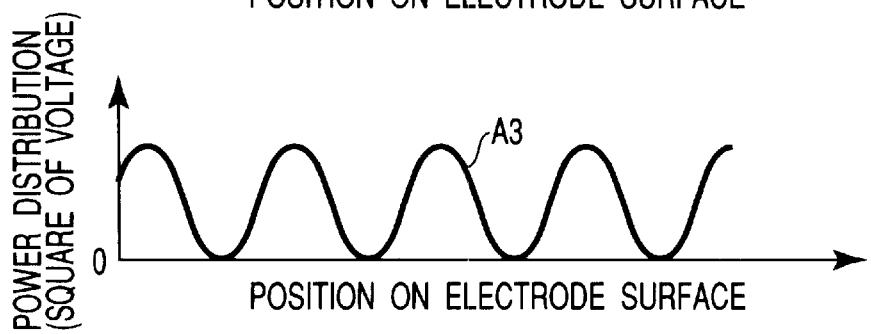
Figure 3:
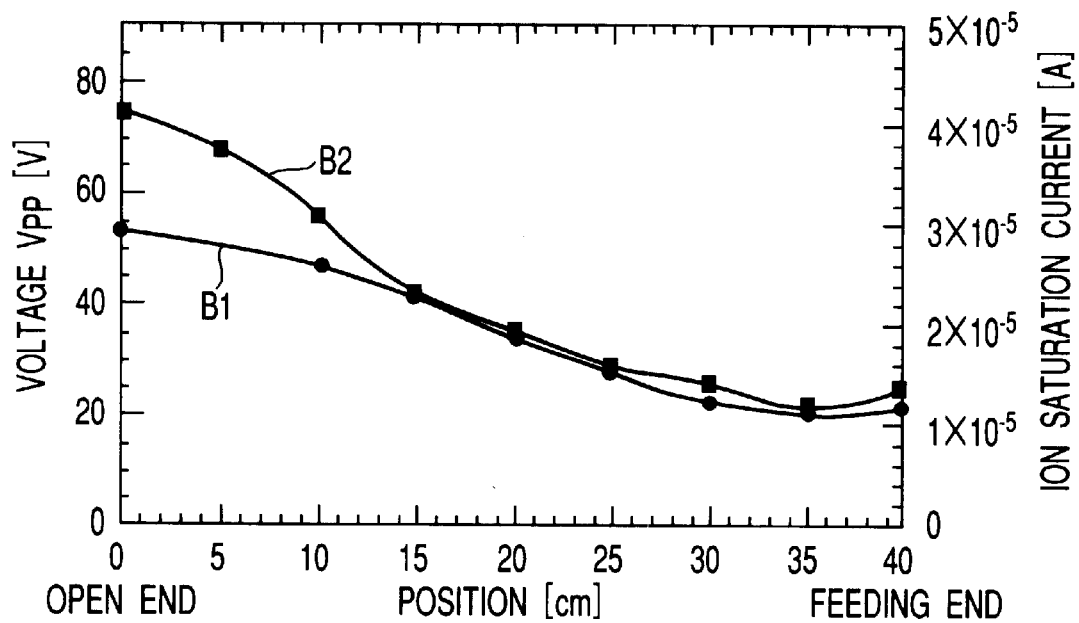
FIG. 3 is a graph showing a voltage distribution and an ion saturation current distribution resulting from a standing wave generated when a high frequency of 100 MHZ is fed to one point of an electrode.
Figure 4:
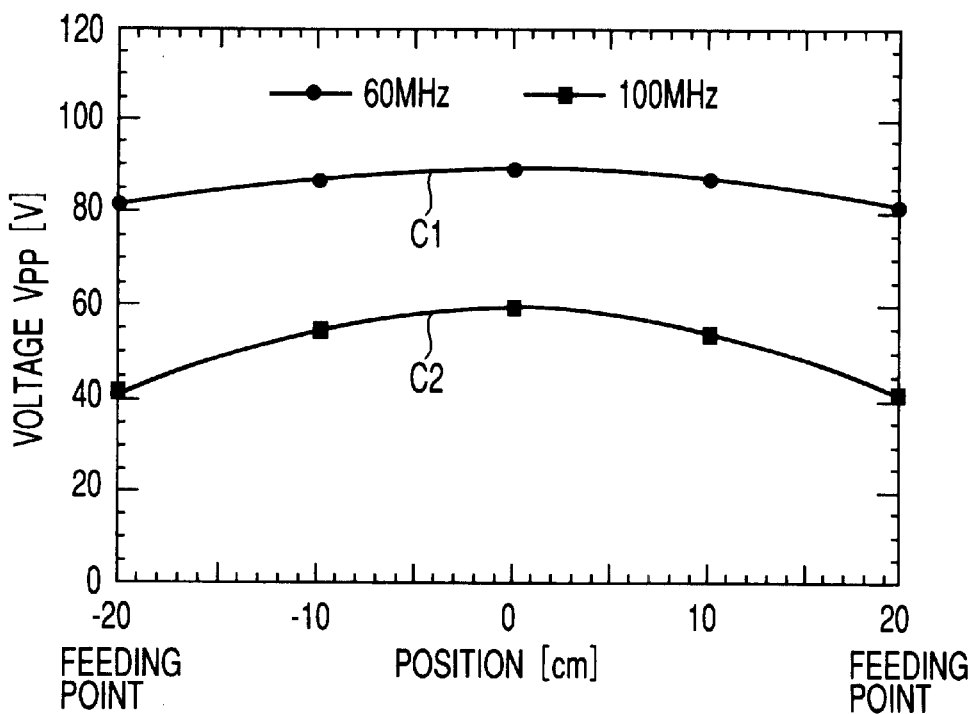
FIG. 4 is a graph showing voltage distributions formed on a ladder electrode when high frequencies of 60 and 100 MHz are fed to the electrode by using a conventional four-point feeding method.
Figure 5:
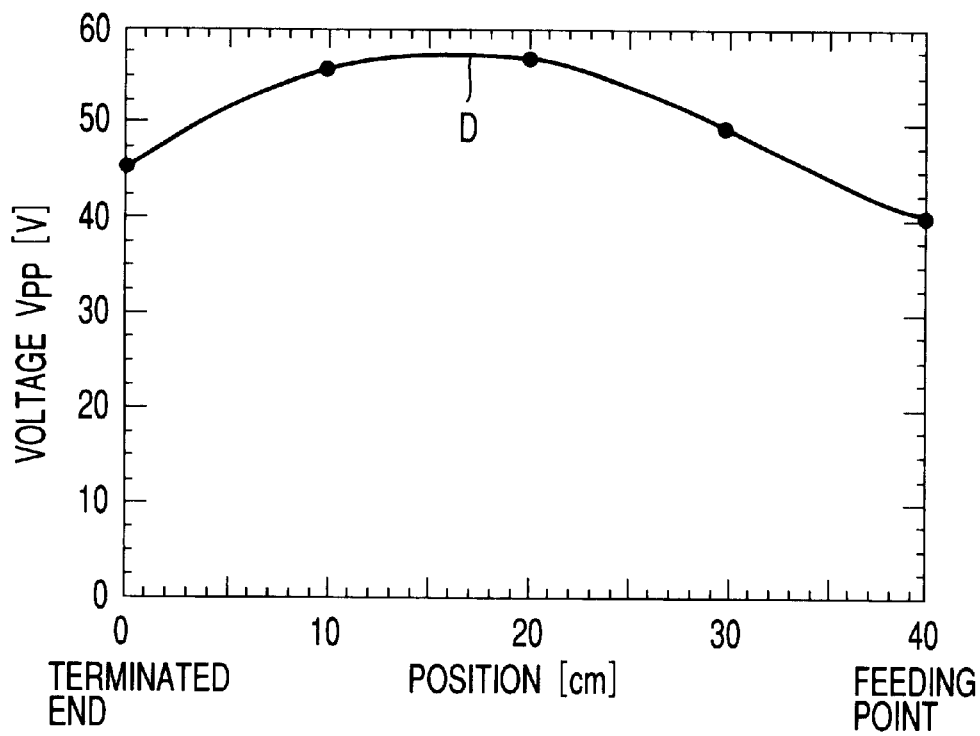
FIG. 5 is a graph showing a voltage distribution formed on a parallel plate electrode when a high-frequency power of 100 MHz is fed to the electrode by a conventional feeding method with one end of the electrode terminated by a lossless reactance (coil)
Figure 9:
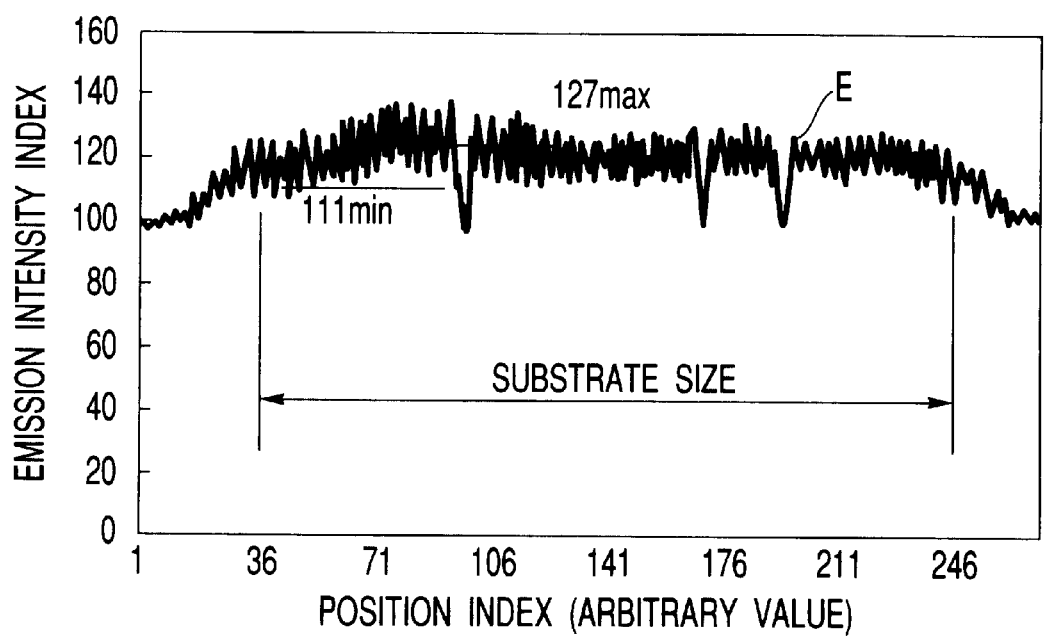
FIG. 9 is a graph showing the result of measurement of the emission intensity distribution of a plasma generated by a method of the first embodiment.
Figure 6A:
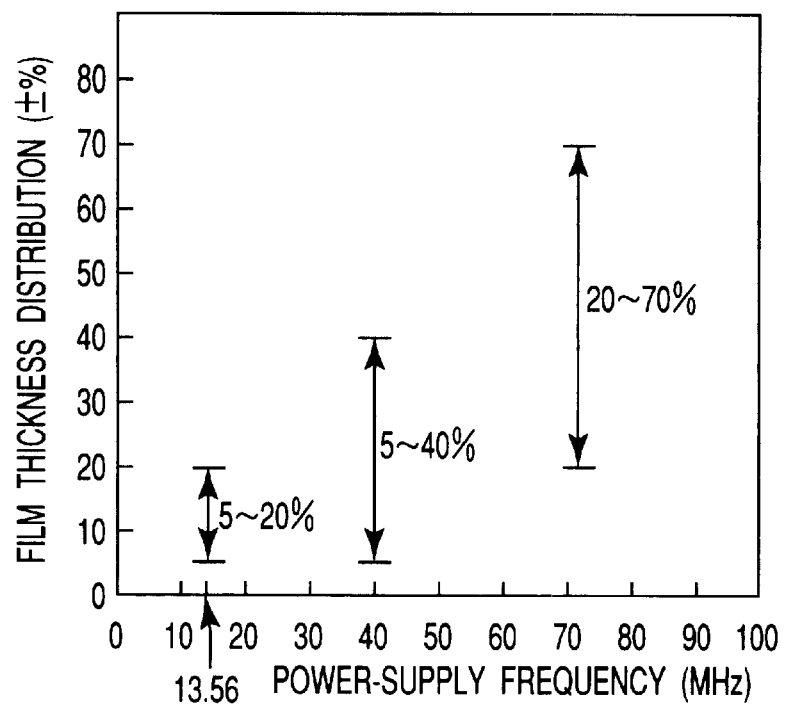
FIG. 6A is a graph showing the correlation between a film thickness distribution and a power-supply frequency when a film is formed on a substrate (500 mm×500 mm) by using a conventional method.
Figure 6B:
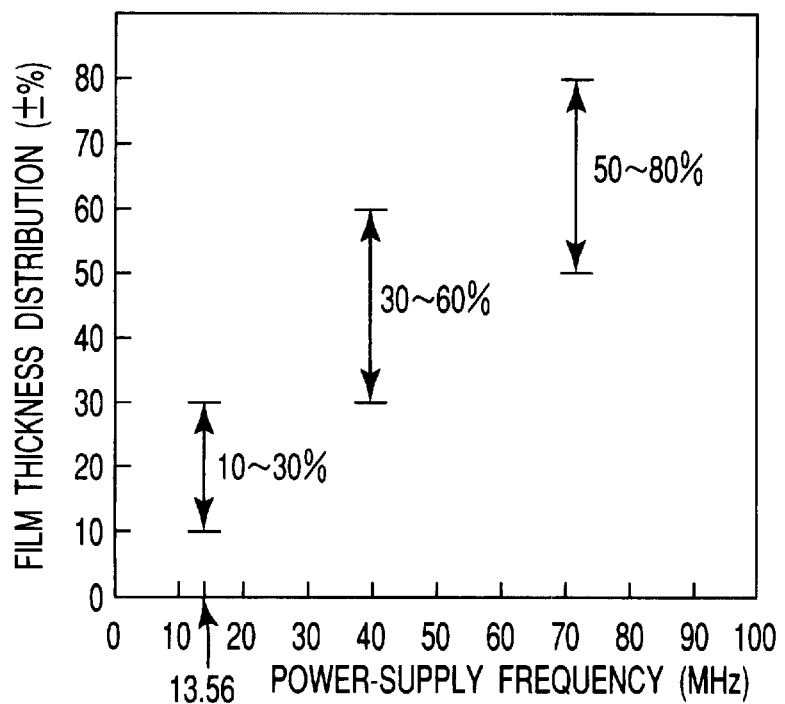
FIG. 6B is a graph showing the correlation between a film thickness distribution and a power-supply frequency when a film is formed on a substrate (1,000 mm×1,000 mm) by using a conventional method.
Figure 7A:
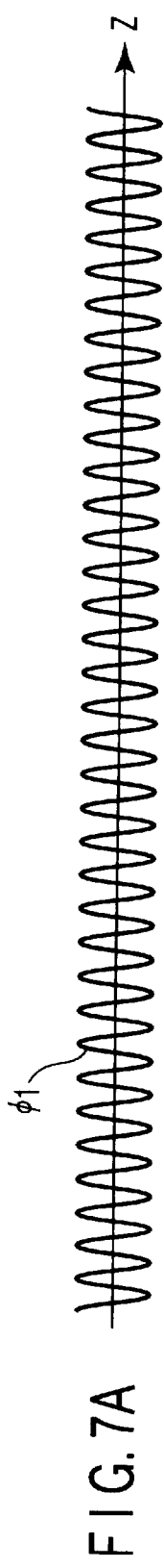
FIG. 7A is a view showing the waveform of a high-frequency wave $\phi_1$.
Figure 7B:
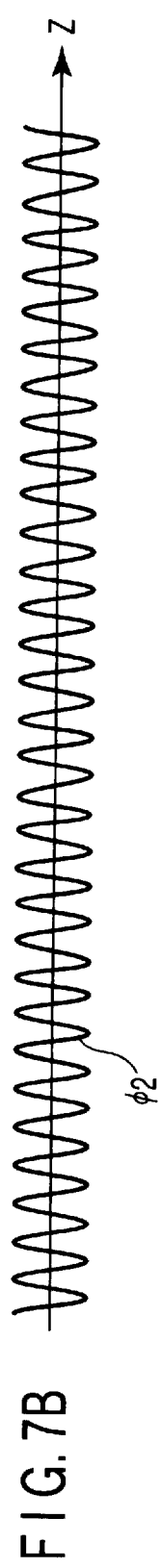
FIG. 7B is a view showing the waveform of a high-frequency wave $\phi_2$.
Figure 7C:
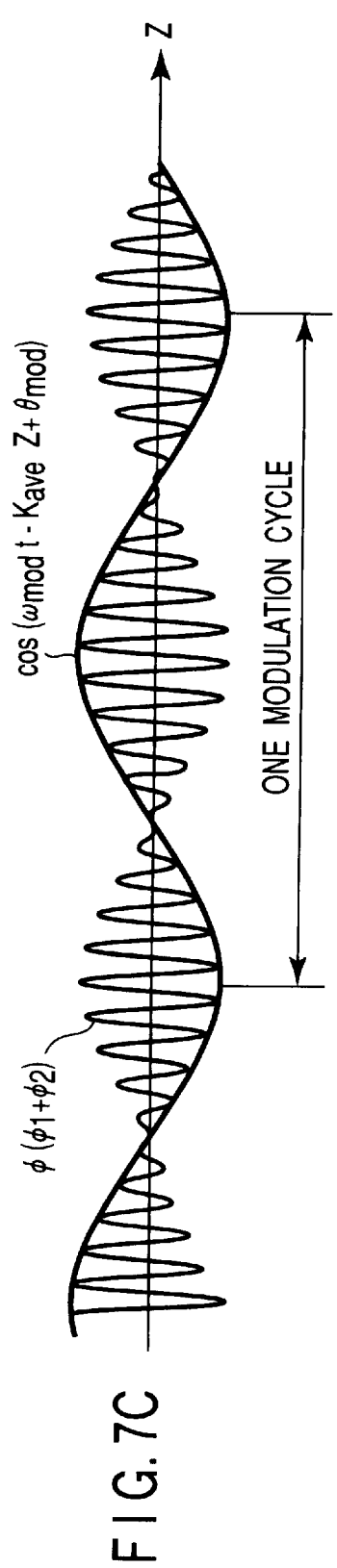
FIG. 7C is a view showing the waveform and envelope of a synthetic wave $\phi$.

FIG. 9 is a graph showing a characteristic curve E obtained by measuring, with a CCD camera, the emission intensity of a plasma generated by using the apparatus 1A of this embodiment. In FIG. 9, a position index (an arbitrary value) on the ladder electrode is plotted on the abscissa, and an emission intensity index (an arbitrary value) is plotted on the ordinate. Referring to FIG. 9, three low-value portions inside the substrate size are behind structures of the apparatus, so the plasma in these portions cannot be seen. Therefore, these portions have no connection with the actual emission intensity distribution. This characteristic curve E shows that in the generation of a discharge plasma using the apparatus 1A, a uniformity of ±7% (a maximum value of 127/a minimum value of 111) of an emission distribution, i.e., a plasma distribution can be achieved in a very large region of 2 m×1.4 m.

The discharge plasma is thus uniformized because "hum (beat)" resulting from 0.5 MHZ as the difference between the first VHF (59.8 MHz) and the second VHF (60.3 MHz) suppresses the generation of a standing wave A3 on the electrode. That is, as explained in item (a) in "BRIEF SUMMARY OF THE INVENTION", an envelope is changed 0.5 million times for 1 sec, i.e., moved at high speed over the distance of 500,000 wavelengths. Therefore, although the envelope has a waveform similar to the standing wave A3 for a very short time period, the amplitude of a voltage can be regarded as having a uniform distribution on time average. So, a plasma generated by this voltage has a substantially uniform distribution. The amplitude of a voltage is the maximum value of the voltage at a certain point.

This can also be considered as follows. Two high-frequency waves supplied to the electrode, i.e., a high-frequency wave (to be referred to as a high-frequency wave A hereinafter) supplied from the power supply $5a$ via the eight first feeding points $9a$ and a high-frequency wave (to be referred to as a high-frequency wave B hereinafter) supplied from the power supply $5b$ via the eight second feeding points $9b_1$ do not interfere with each other because they have different frequencies. Therefore, the amplitude distribution of the voltage of the high-frequency wave A and the amplitude distribution of the voltage of the high-frequency wave B are independent of each other. The actual voltage distribution is the superposition of the two.

Assuming that the attenuation of a high-frequency wave can be neglected and the reflection at the electrode end is negligibly small, the high-frequency waves A and B uniformly progress with no attenuation from the two ends of the longitudinal rods 304, so the superposition of the two high-frequency waves forms a uniform distribution. This is the gist of this embodiment.

Figure 10A:
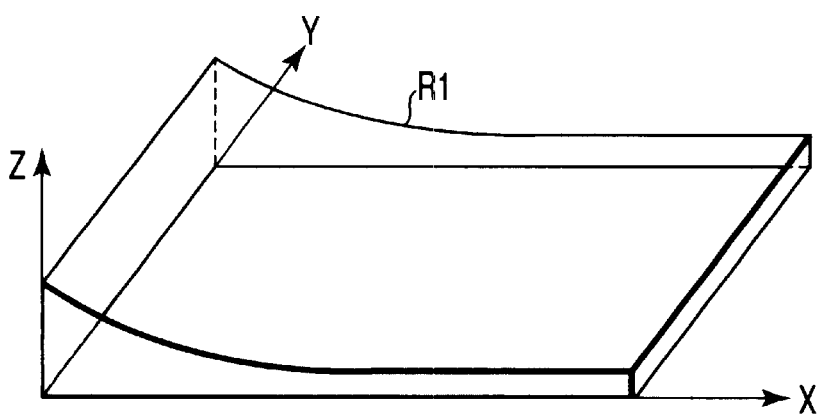
FIGS. 10A to 10C are tree-dimensional graphs each showing the distribution of the amplitude of a discharge electrode in the lateral and longitudinal directions of the electrode.
Figure 10B:
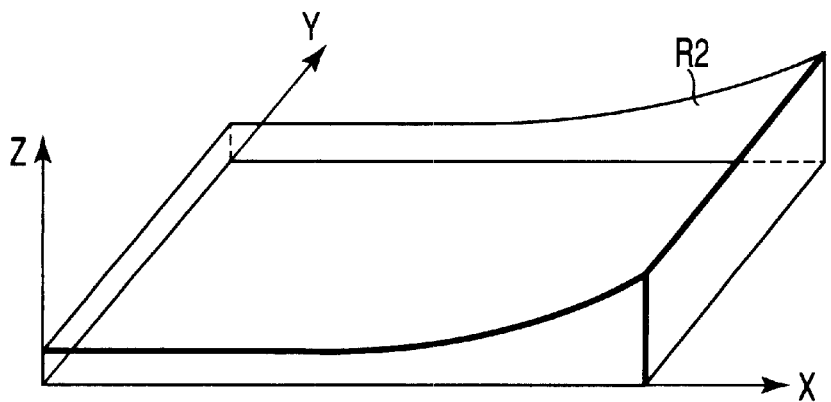
Figure 10C:
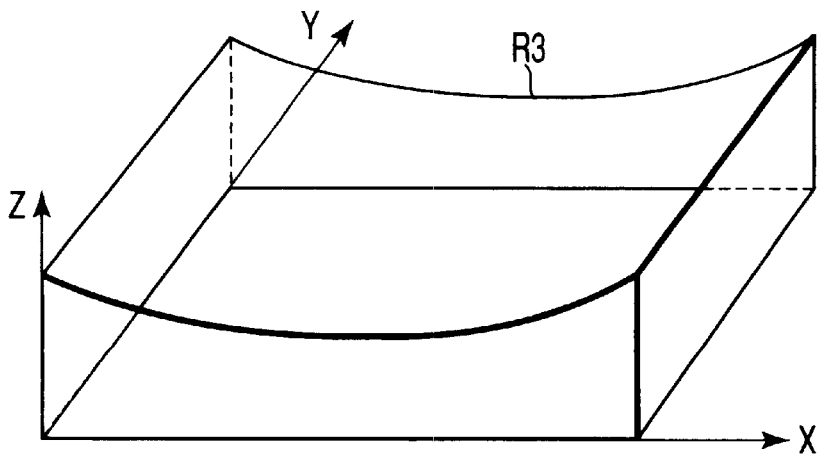

In practice, however, the phenomenon is slightly complicated because attenuation and reflection do occur, so these attenuation and reflection will be described below. First, attenuation will be explained. When attenuation occurs, the amplitude distribution of the voltage of the high-frequency wave A is indicated by R1 shown in FIG. 10A. Referring to FIG. 10A, the direction of the lateral rods 305 is the Y axis, the direction of the longitudinal rods 304 is the X axis, and the amplitude of the voltage is the Z axis. In the direction (the Y axis) of the lateral rods 305, the voltage amplitude is substantially constant because the eight feeding points $9a$ are closely arranged. On the other hand, in the direction (the X axis) of the longitudinal rods 304, the voltage amplitude attenuates from the feeding side, and this produces a distribution. As indicated by R2 shown in FIG. 10B, the amplitude of the voltage of the high-frequency wave B also attenuates from the opposite feeding side. As indicated by R3 in FIG. 10C, the distribution of the amplitude of the voltage formed by synthesizing the high-frequency waves A and B has high uniformity. Accordingly, a plasma having a substantially uniform distribution density is generated.

Figure 11A:
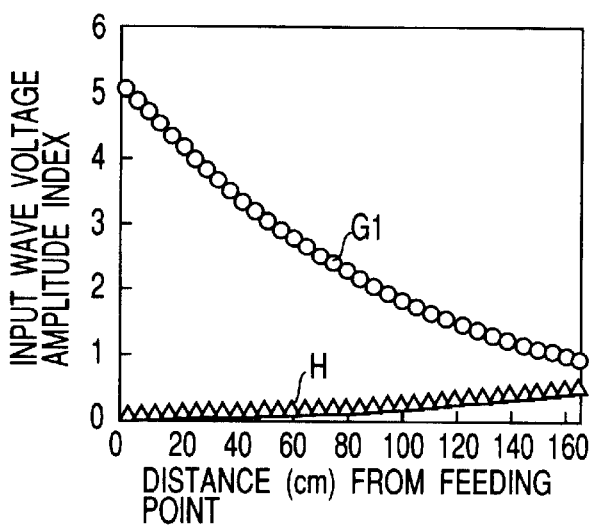
FIG. 11A is a graph showing the correlation between the distance from a feeder distribution center and a progressive wave voltage amplitude index and the correlation between the position from a reflection point and a reflected wave voltage amplitude index.
Figure 11C:
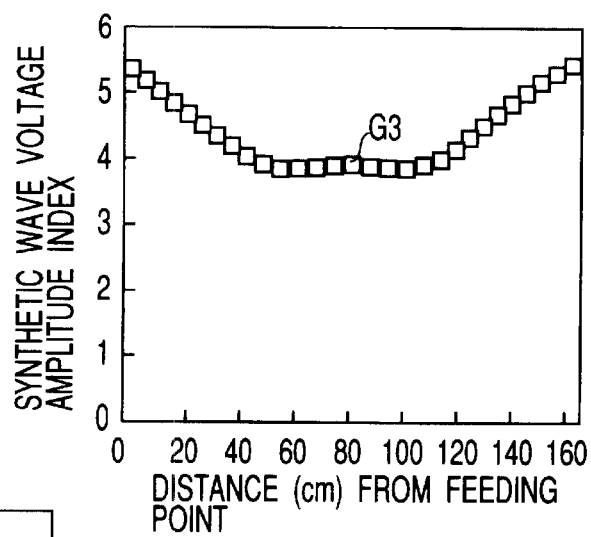
FIG. 11C is a graph showing the correlation between the distance from one feeder distribution center, when power is supplied from the two ends of an electrode, and a synthetic wave voltage amplitude index.
Figure 11B:
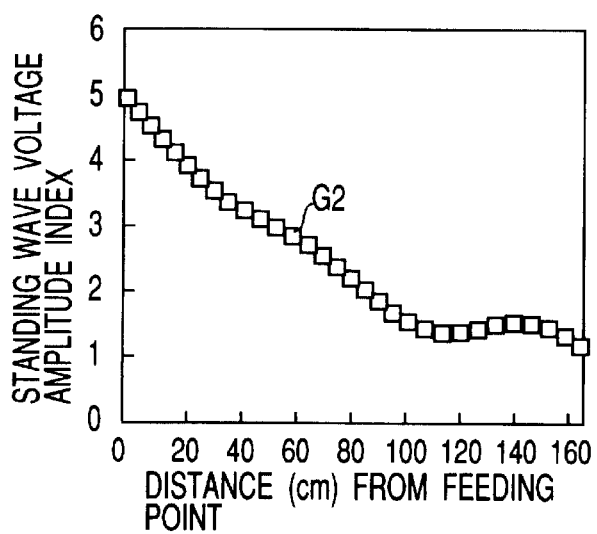
FIG. 11B is a graph showing the correlation between the distance from a feeder distribution center and a standing wave voltage amplitude index.

Since reflection at the electrode end cannot be neglected in practice, this reflection at the electrode end will also be explained in addition to the above attenuation. Referring to FIG. 11A, the distance (cm) from the feeding points in the direction of the longitudinal rods 304 is plotted on the abscissa, and the amplitude distribution of the voltage of the high-frequency wave A is plotted on the ordinate. FIG. 11A does not show the distribution in the direction of the lateral rods 305 because this distribution is substantially uniform as indicated by R1 in FIG. 10A, and shows only one-dimensional distribution in the Y-axis direction of the longitudinal rods 304. A progressive wave G1 of the high-frequency wave A progresses toward the electrode end while attenuating from the feeding points. Since reflection occurs at the electrode end, the high-frequency wave A is reflected at the electrode end to form a reflected wave H, and this reflected wave H progresses to the feeding points. FIG. 11B shows the amplitude distribution of a voltage generated by the synthesis of the progressive wave G1 and the reflected wave H. Since the progressive wave G1 and the reflected wave H have the same frequency and interfere with each other, addition taking account of the phase is necessary. A synthetic wave G2 does not monotonously attenuate and has a standing-wave-like distribution. FIG. 11B shows that a minimal point is generated near 120 cm. The high-frequency wave B also forms a similar distribution. Since the high-frequency waves A and B have different frequencies and hence do not interfere with each other, they can be simply synthesized by addition, and a substantially uniform distribution as shown in FIG. 11C is obtained. In this embodiment, a reflected wave H of a synthetic wave G3 was small, resulting in a slight standing-wave-like distribution. Therefore, a substantially uniform voltage distribution was finally obtained, so a uniform plasma was generated.

As described above, in this embodiment a substantially uniform distribution was obtained because the reflected wave H was small and had little influence. However, if a high-frequency wave (e.g., the high-frequency wave A) fed from one end does not attenuate before reaching the other end, a reflected wave generated by the reflection of this high-frequency wave interferes with the progressive wave. Since this makes the standing wave appreciably large, no uniformity can be obtained any longer. Hence, a high-frequency wave preferably sufficiently attenuates before arriving at the other end. More specifically, when at the other end of the electrode the voltage of a progressive wave attenuates to about 50% of that at the feeding points, the reflected wave H generated there becomes about 25% (=50%×½) as shown in FIG. 11A, so a substantially uniform voltage distribution is obtained. If the voltage of a progressive wave attenuates to about 75%, the film thickness distribution is not substantially affected although a slight voltage distribution is formed.

Referring to FIG. 12, the abscissa indicates the VHF frequency (MHz), and the ordinate indicates the distance (cm) from the feeding points. A characteristic curve J shows the distance the progressive-wave voltage attenuates to about 50%, which is approximated by equation $L=4\times10^3/f$. A characteristic curve K shows the distance the progressive-wave voltage attenuates to about 75%, which is approximated by equation $L=2\times10^3/f$. Accordingly, the length L of the electrode from one end as a feeder distribution center (incident point) to the other end as a reflection point satisfies preferably inequality $L\geq2\times10^3/f$, and more preferably, $L\geq4\times10^3/f$. Within the range of equation $L>20\times10^3/f$, attenuation is too large, and no uniformization is possible. Therefore, $L\leq20\times10^3/f$ is preferably met.

Symbol f represents a VHF (MHz).

The frequency difference between the high-frequency waves A and B will be described below by returning to the concept of high-speed movement of an envelope. The larger this frequency difference, the higher the speed at which an envelope is moved. However, to obtain a desired film formation rate and film formation quality, it is undesirable to use a high-frequency wave B with a frequency having a difference of 20% or more from that of the high-frequency wave A. Also, to allow an impedance matching circuit to function which is used to prevent incidence of VHF power to a power supply, the difference between the two VHFs is more preferably 1% or less.

In this embodiment, the difference between the two VHFs was about 0.8%. Therefore, the film formation rate and quality were high, and incidence of a high-frequency wave to the power supply could be suppressed to a low value, about 100 W.

The above apparatus 1A was used to form a thin Si semiconductor film (an a-Si film or a nanocrystalline Si film) for a solar cell on a glass substrate following the procedures described below.

First, the temperature of the ground electrode 3 was set to 200° C. by heating by the heater. 2 m×1.4 m substrate G was placed on this ground electrode 3. $SiH_4$ gas was supplied at a flow rate of 2,000 sccm from the gas supply unit 71 into the reaction vessel 2. In the case of nanocrystalline Si film formation, hydrogen gas was supplied at, e.g., 50,000 sccm in addition to the $SiH_4$ gas. The operation of the exhaust unit 72 was controlled by the controller 3 to adjust the internal pressure of the reaction vessel 2 to 200 mTorr.

While the first and second impedance matching circuits 7a and 7b were so adjusted as to allow efficient supply of VHF power to a plasma, VHF power at a frequency of 59.8 MHz was supplied from the first power supply 5a, and VHF power at a frequency of 60.3 MHz was supplied from the second power supply 5b. These VHF power components were supplied to the ladder electrode 303 such that the total power from the two power supplies 5a and 5b was, e.g., 3,000 W, thereby generating a discharge plasma between the substrate G and the ladder electrode 303. In this discharge plasma, $SiH_4$ decomposed to form an a-Si film or a nanocrystalline Si film on the surface of the substrate G. That is, a thin film having a desired film thickness was formed by performing film formation in this state for, e.g., about 10 min. The film thickness distribution of the formed film sample was measured, and the feeder distribution center positions were finely adjusted so that an optimum distribution was obtained. The film formation rate was as high as 1.0 nm/sec in the formation of a nanocrystalline film, and the uniformity was slightly over ±10%. That is, the uniformity necessary for an Si thin-film semiconductor of a solar cell was achieved.

In this arrangement, different VHFs are unintentionally supplied by using different power supplies. However, intentionally setting different frequencies is of course similarly effective.

FIG. 13 is a graph showing the correlation between the frequency difference (MHz) between two high-frequency waves and the film thickness distribution (%) of a film formed on a substrate, by plotting the frequency difference on the abscissa and the film thickness distribution on the ordinate. While the frequency of the high-frequency wave A was fixed to 60.0 MHz (a fundamental frequency), the frequency of the high-frequency wave B was changed to form a-Si films on 2.0 m×1.4 m rectangular glass substrates. As is apparent from a characteristics curve F, the film thickness distribution was 10% or less when the frequency difference between the two high-frequency waves A and B was 1.5 to 6.0 MHz. Also, the film thickness distribution was lower than 15% when the frequency difference was 1.0 to 10.0 MHz and lower than 20% when the frequency difference was 0.5 to 10.0 MHz. Furthermore, even when the frequency difference was only 0.1 MHz, the film thickness distribution exceeded 20% only slightly.

Furthermore, when the film thickness of a thin silicon film formed on a large-area substrate G (2 m×1.4 m) was measured by Raman spectroscopy, the peak ratio of a Raman spectrum exceeded 9:1. This proves that the film had high quality as a thin film for a solar cell. Also, the refractive index, spectral characteristics, and defect density of the thin film were measured. Consequently, the measured values were substantially equal to values measured when a film was formed on a small-area sample substrate (5 cm×5 cm) by using the same VHF (60 MHZ).

A high-quality thin film is formed on the large-area substrate G as described above because plasma ON/OFF caused by the high-speed movement of an envelope is much shorter than the life of active species (radicals). That is, in this embodiment the difference between the two VHFS is 0.5 MHz. Therefore, ON/OFF is repeated 500,000×2 times per second, and one OFF time is $1\times10^{-6}$ sec. This OFF time is much shorter than the extinction life $((\tau=(2 \text{ (cm)})^2/(2\times2.5\times10^3 \text{ (cm}^2/\text{sec)})=8\times10^{-4}$ sec) of an $SiH_3$ active molecule, and is much shorter than the extinction life ($1.1\times10^{-4}$ sec) of a hydrogen atom radical. Accordingly, ON/OFF of the plasma is substantially negligible in the actual film formation.

Note that another effect obtained by this embodiment is the very small amount of particles produced during the film formation. This is presumably because, as described in "Silane Gas Decomposition by High-Frequency Modulation Discharge", Discharge Research No. 138, pp. 27 to 36, 1992 (to be referred to as reference 7 hereinafter), substantially no particles are produced when the ON/OFF frequency is in the range of 0.5 Hz (inclusive) to 100 kHz (inclusive), i.e., the ON time is in the range of 0.01 msec (inclusive) to 1 sec (inclusive), and preferably when the ON/OFF frequency is 10 kHz or less, i.e., the ON time is 0.1 msec or more. That is, since the growth time of particles is about 1 sec, no particles increase for an ON time of 1 sec or less. However, when the ON/OFF frequency is 100 kHz or more, i.e., when the OFF time is 0.01 msec or less, a state in which plasma is not regarded to be off is set. That is, in this embodiment almost no particles were produced when the ON/OFF frequency was set to 10 kHz, i.e., when the ON time was set to 0.1 msec.

Furthermore, it is also possible to prevent an increase in particles by discharging particles over a sufficient time by prolonging the OFF time. That is, when a substrate area S is 200×200 $cm^2$, a distance $\Delta x$ from the discharge electrode to the substrate is 2 cm, and a volume flow rate Q is $4\times10^5$ $cm^3$/sec, a discharge region dwell time t of a source gas is calculated to be 0.2 sec by substituting these values into equation (10) below. Therefore, by setting the OFF time to be longer than the time t, i.e., 0.2 sec or more, preferably twice the time t, i.e., 0.4 sec or more, it was possible to discharge particles from the plasma generation region and suppress an increase in particles in the reaction vessel.

$$t \approx (S \cdot \Delta x)/Q \qquad (10)$$

In this embodiment, a ladder electrode was used as the electrode. When a mesh electrode reported in the reference 4 cited previously was used instead of the ladder electrode, a film thickness uniformity of 10% or less could be obtained. This electrode is a kind of a ladder electrode and has a large number of lateral electrode rods 305 according to this embodiment.

Also, this embodiment has been explained by taking the use of VHFs around 60 MHz as an example. However, analogous effects were obtained even when VHFs around 20, 200, and 700 MHz were used.

Second Embodiment

The second embodiment of the present invention will be described below with reference to FIG. 14. An apparatus 1B of this embodiment is obtained by partially changing the VHF feeder circuit of the apparatus 1A of the first embodiment described above. This change in the feeder circuit permits the apparatus 1B to have an operation condition range wider than that of the apparatus 1A. Also in this embodiment, the apparatus is used to form a uniform film on a 2 m×1.4 m substrate by using VHFs, and the arrangements of a reaction vessel and the like except for a power-supply system are the same as in the first embodiment. So, an explanation of points common to the two embodiments will be omitted.

The apparatus 1B of the second embodiment differs from the apparatus 1A of the first embodiment in four points ① to ④ below.

① The oscillation frequencies of high-frequency power supplies. In the apparatus 1A, two different frequencies are generated by using the uncertainty of the built-in quartz oscillators of the high-frequency power supplies 5a and 5b. In the apparatus 1B, a two-wave signal generator 20B controls the frequency difference to a constant value. In the former apparatus (the apparatus 1A), no arbitrary frequency difference can be selected. Accordingly, if the two oscillators have a frequency difference of only 10 Hz, the envelope distribution moves only 10 Hz, so a plasma turns on/off at this cycle to adversely affect film formation. Also, the oscillation frequency difference does not stabilize with time. This may result in low reproducibility. In contrast, the latter apparatus (the apparatus 1B) can be operated with a fixed optimum frequency difference.

② In the apparatus 1A, protection circuits (not shown) of the two high-frequency power supplies 5a and 5b are also independent of each other. However, the apparatus 1B has only one protection circuit 22. Input power components to power supplies 5a and 5b are measured by power meters $6a_1$ and $6b_2$ and, if one of the two magnitudes exceeds a limiting value, the outputs from both the power supplies are restricted. In the former apparatus (the apparatus 1A), if the input power (the sum of the reflected power and the input power from the second power supply 5b) to the first power supply 5a exceeds the tolerance of the first power supply 5a for some reason, the protection circuit of this first power supply suppresses the output from the first power supply 5a. However, the excess input from the second power supply 5b is not suppressed at all and kept supplied. Hence, in the worst case the first power supply 5a is damaged.

In contrast, if the same even occurs in the latter apparatus (the apparatus 1B), the excess input to the first power supply 5a activates the protection circuit 22 to suppress the outputs from both the first and second power supplies 5a and 5b. Since the input power to the first power supply 5a is suppressed, this first power supply 5a is not damaged. While the input power is thus suppressed, an impedance matching circuit 7b is adjusted to remove the cause of the excess input from the second power supply 5b. This makes it possible to again increase the outputs from the two power supplies 5a and 5b and supply desired power.

In the apparatus 1B, isolators 24a and 24b are inserted into first and second feeder circuits to prevent excess input power components to the power supplies 5a and 5b, respectively. Hence, no protection circuit is particularly necessary. However, if the reflected power exceeds the allowable power of the isolators 24a and 24b to make these isolators 24a and 24b inoperable, the protecting operation by this protection circuit 22 is required.

③ In the apparatus 1A, the impedance matching circuit 7a is the only means for suppressing the input power (the sum of the reflected power and the input power from the second power supply 5b) to the first power supply 5a. In the apparatus 1B, however, the isolators 24a and 24b each comprising a circulator and load are inserted to eliminate the input power from the electrode 303 to the power supplies 5a and 5b.

In the former apparatus (the apparatus 1A), even when the power generated by reflecting the output from the first power supply 5a by the electrode 303 can be completely reduced to zero by the impedance matching circuit 7a, the input power from the other power supply, i.e., the second power supply 5b via the electrode 303 and the impedance matching circuit 7a cannot be simultaneously reduced to zero, because the phases and frequencies are different. Therefore, if this power is large (the power transmitted through the electrode 303 varies, i.e., increases or decreases, in accordance with the generated state of a plasma), large power is input to the first power supply 5a to make the state of this first power supply 5a unstable. In the worst case, an excess input may destroy the first power supply 5a. This situation readily occurs especially when there is no plasma load before plasma generation.

In contrast, in the latter apparatus (the apparatus 1B) the isolators 24a and 24b are inserted into the feeder circuits. Accordingly, inputs to the power supplies 5a and 5b can be completely absorbed by the loads, and this prevents destruction of the power supplies 5a and 5b by an excess input.

The frequency band width of an isolator, especially the isolators 24a and 24b having kW-class high-frequency power as a rated value as used in this embodiment, is very narrow. That is, the frequency band width at a high-frequency power of 1 kW or less is about 4% of the frequency used, and that at a high-frequency power of about 2 kW is about 1% of the frequency used. Hence, the frequency difference between the first and second power supplies 5a and 5b must be decreased to these values. In this embodiment, the oscillation frequency of the first power supply 5a is set at 60.2 MHz, and the oscillation frequency of the second power supply 5b is set at 59.8 MHz. Consequently, the oscillation frequency difference between the two power supplies 5a and 5b is set to 0.6 MHz or less which corresponds to a frequency band width of 1% at a rated power of 2 kW.

④ In the apparatus 1A, each system includes one of the two power meters 6a and 6b (two power meters in total). In the apparatus 1B, one system includes the two power meters $6a_1$ and $6a_2$, and another system also includes two power meters $6b_1$ and $6b_2$ (four power meters in total). Since the isolators 24a and 24b are inserted into the feeder circuits, input power components to the power supplies 5a and 5b, i.e., the reflected power components in the power meters $6a_1$ and $6a_2$ are normally zero regardless of the impedance matching state. To optimize the impedance matching state, therefore, it is necessary to arrange the power meters $6a_2$ and $6b_2$ closer to the impedance matching circuits than the isolators 24a and 24b and measure the return power components from the impedance matching circuits 7a and 7b.

Although the above improvements complicated the apparatus, a total input power of 4 kW was obtained. Hence, a high film formation rate of 1.5 nm/sec was obtained in, e.g., nanocrystalline film formation. The film thickness uniformity was ±10%. This clears the film thickness uniformity requirement necessary for an Si thin-film semiconductor of a solar cell.

Third Embodiment

The third embodiment of the present invention will be described below with reference to FIGS. 15 to 20.

Figure 15:
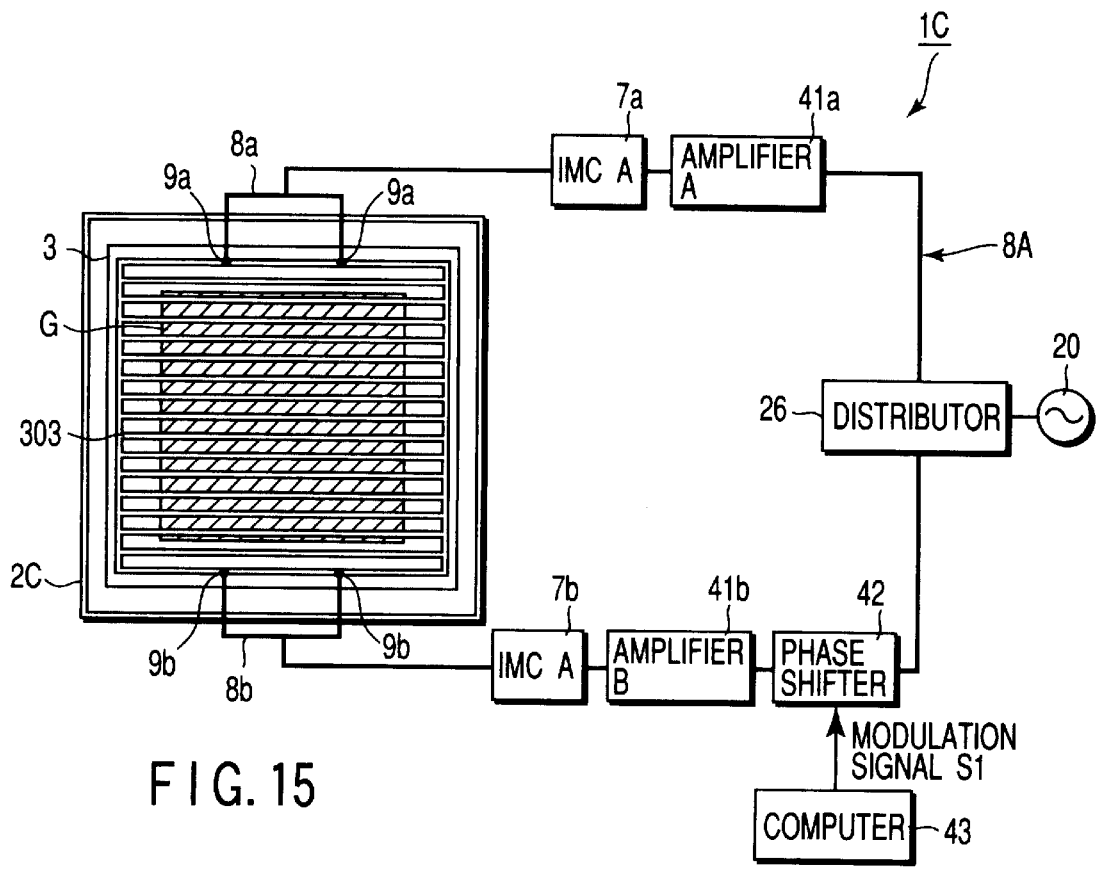
FIG. 15 is a block diagram showing a feeder circuit of an apparatus used in a method of feeding power to a discharge electrode according to the third embodiment of the present invention.

As shown in FIG. 15, a plasma CVD apparatus 1C comprises a vacuum chamber 2C for surrounding a substrate G, a ladder electrode 303 opposed to the substrate G in this vacuum chamber 2C, and a feeder circuit 8A for feeding power to this ladder electrode 303. The vacuum chamber 2C communicates with a vacuum pump via an exhaust passage (not shown) and is evacuated to about an internal pressure of $1 \times 10^{-3}$ to $1 \times 10^{-7}$ Torr. Also, a gas supply pipe (not shown) is placed behind the electrode 303 in the vacuum chamber 2C. When silane or disilane is supplied as a film formation process gas from a gas supply source to the gas supply pipe, this process gas is supplied from a large number of inlet ports to a space between the electrode 303 and the substrate G.

The substrate G is held by a ground electrode 3 and heated to a predetermined temperature region by a built-in heater (not shown). AS this substrate G, a transparent glass substrate 1 mm thick, 460 mm wide, and 460 mm long was used.

The ladder electrode 303 as a discharge electrode is formed by assembling round rod electrode members at equal pitches into the form of a lattice. This ladder electrode 303 is connected to a feeder (central conductor) 6 of the circuit 8A by four feeding points 9a and 9b. The two feeding points 9a are formed in positions which divide the round rod electrode member placed at one end into three substantially equal parts. The other two feeding points 9b are formed in positions which divide the round rod electrode member placed at the other end into three substantially equal parts. The ladder electrode 303 has dimensions of, e.g., 520 mm×520 mm, and the round rod electrode member has a diameter of, e.g., 6 mm.

The feeder circuit 8A includes a high-frequency oscillator 20, a distributor 26, a phase shifter 42, a pair of amplifiers 41a and 41b, and a pair of impedance matching circuits 7a and 7b. The high-frequency oscillator 20 is connected to the amplifiers 41a and 41b via the distributor 26. The amplifiers 41a and 41b are connected to the impedance matching circuits 7a and 7b which are connected to the feeding points 9a and 9b, respectively.

An output circuit of the distributor 26 branches into two parts, and one of these branched circuits 8A includes the phase shifter 42 driven and controlled by a computer 43. Each branched circuit 8A further branches into two circuits 8a and 8b. These branched circuits 8a and 8b are connected to the electrode 303 via the feeding points 9a and 9b, respectively.

A quartz oscillator having a rated frequency of 60 MHz was used as the high-frequency oscillator 20. A full solid-state element type analog voltage-controlled phase shifter was used as the phase shifter 42. The high-frequency oscillator 20 oscillates a very high frequency (VHF), and this VHF is distributed by the distributor 26 and fed to the electrode 303 via the amplifiers 41a and 41b, the impedance matching circuits 7a and 7b, and the feeding points 9a and 9b. on the basis of a predetermined processing data signal transmitted from the computer 43, the phase shifter 42 performs high-speed phase modulation for one distributed VHF at a repetition rate of a maximum of 100 kHz.

Figure 16:
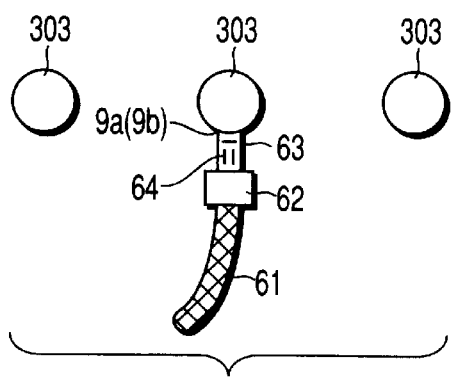
FIG. 16 is an enlarged view of a portion where a feeding terminal is attached to an electrode.
Figure 17:
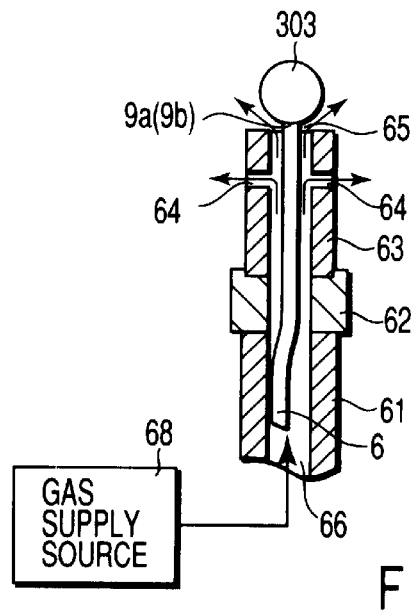
FIG. 17 is a sectional block diagram showing, in an enlarged scale, the portion where the feeding terminal is attached to the electrode.

As shown in FIGS. 16 and 17, the feeder (central conductor) 6 is passed through a coaxial cable 61 and connected to the electrode 303 by the feeding points 9a and 9b. An insulator 63 is mounted on the end portion of the coaxial cable 61 by a coupling 62, thereby insulating the electrode 303 from the sheath of the cable 61. A plurality of holes 64 are formed in side portions of the insulator 63. A gas passage 66 in the coaxial cable 61 communicates with a gas supply source 68 and the holes 64 of the insulator. The gas supply source 68 contains industrially pure hydrogen gas $H_2$. This hydrogen gas is supplied from the gas supply source 68, passed through the gas passage 66 in the cable 61, and blown off from the side holes 64 and an upper-end hole 65, thereby blowing away a silane plasma existing at the feeding points 9a and 9b and its vicinity. Simultaneously, a plasma having a high hydrogen concentration etches unnecessary film formation components deposited on the insulator 63 and the like near the feeder distribution center. The blow of this hydrogen gas effectively prevents the deposition of unnecessary film formation components and the generation of particles near the feeding points 9a and 9b as an electric field concentrated portion.

In the above embodiment, the deposition of film formation components and the generation of particles are prevented by blowing pure hydrogen gas against each feeder distribution center. However, the present invention is not limited to this embodiment. That is, a similar effect can be obtained by blowing another gas such as argon gas against each feeder distribution center.

Furthermore, the method of the present invention is applicable not only to feeding points but also to parts where the deposition of unnecessary film formation components and the generation of particles are undesirable. For example, if a silicon film is deposited on an insulator pillar for supporting an electrode, the creeping insulation strength of the pillar lowers. In the worst case, a line-to-ground fault occurs. When a hydrogen local supply method analogous to the one described above was performed for this pillar, deposition was suppressed and no line-to-ground fault occurred.

The formation of a nanocrystalline Si film on a glass substrate using the plasma CVD film forming apparatus will be described below.

The film formation conditions were substrate dimensions of 46 cm×46 cm, a substrate temperature of 200° C., a reaction vessel internal pressure of 150 mTorr, a silane gas supply amount of 50 sccm, and a hydrogen gas supply amount of 1,500 sccm.

When the frequency of high-frequency power was set at 60 MHz and the distance between electrode and substrate was set at 10 mm in this apparatus, a standing wave was generated by the conventional feeding method, and no uniform film formation was possible.

Figure 18:
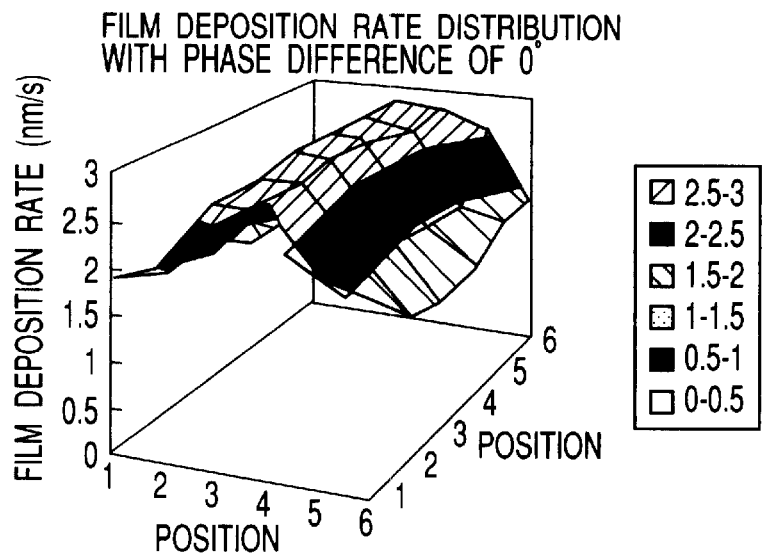
FIG. 18 is a three-dimensional view showing a film formation rate distribution with a phase difference of 0°.
Figure 19:
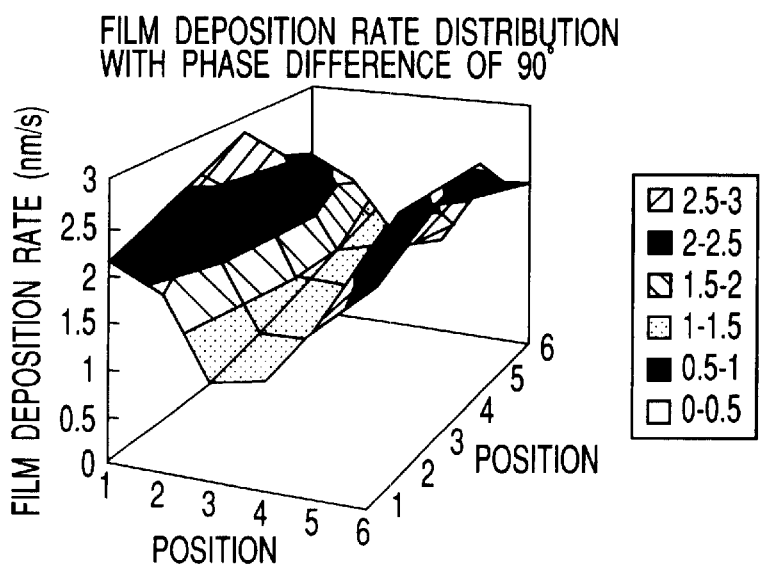
FIG. 19 is a three-dimensional view showing a film formation rate distribution with a phase difference of 90°.

FIGS. 18 and 19 are three-dimensional graphs showing film formation rate distributions when the phase difference is set to constant values of 0° and 90°, respectively, by a phase modulator. Referring to FIGS. 18 and 19, the positions on a substrate with respect to the discharge electrode are plotted on the X and Y axes, and the deposition rate (nm/sec) is plotted on the ordinate. As shown in FIGS. 18 and 19, with the fixed constant phase difference an envelope remains still as a standing wave to produce a deposition rate distribution. FIGS. 18 and 19 also reveal that the deposition rate distribution can be changed by changing the phase difference. This is principally because the change in the phase difference changes the envelope distribution (varies the nodes and antinodes of the standing wave distribution).

In this embodiment, therefore, high-frequency power components are supplied from two feeding systems, and the phase difference between them is changed with time, thereby moving the envelope and obtaining a uniform film thickness distribution by time quadrature. This is equivalent to case (b) (the method of supplying high-frequency waves having the same frequency while changing the phase difference with time) in "BRIEF SUMMARY OF THE INVENTION".

If the above phase difference is slowly changed, active molecules or atoms in the plasma increase or decrease accordingly. Therefore, the arrival flux of these molecules or atoms with respect to the substrate varies with time, and this raises or lowers the deposition rate. In the worst case, a state equivalent to plasma OFF by which no film is formed appears. Additionally, the quality of deposited films temporally changes, and this change sometimes influences the quality of the film finally formed. This is a problem in a nanocrystalline type silicon thin-film solar cell in which delicate film quality is important. This makes the formation of a uniform, high-quality film on a large-area substrate difficult.

Also, if a mechanical phase modulator is used instead of a phase shifter, frequent maintenance is necessary because sliding portions wear. Additionally, high-speed phase modulation is impossible.

In the method of the present invention, however, the computer 43 rapidly and accurately controls the phase shifter 42, and the high-speed phase modulation by this phase shifter 42 shifts the phase of high-frequency power supplied to one end of the electrode 303 from the phase of high-frequency power supplied to the other end. Hence, in a certain instant an envelope distribution is generated on the electrode 303 to produce local variations in the voltage amplitude distribution. In the whole processing time, however, the voltage amplitude distribution on the electrode 303 is averaged, and the density of a plasma generated between the electrode 303 and the substrate G is uniformized.

When this phase modulation circuit 8A is used to rapidly modulate a high frequency at a maximum of 100 kHz, the envelope generated on the electrode moves at the same frequency. This movement is much shorter than the life of $SiH_3$ active molecules or H active atoms dominating film deposition. Therefore, the flux of these active molecules or atoms arriving at the substrate hardly changes with time. This allows the deposition of a film having a uniform film thickness and uniform film quality.

Figure 20:
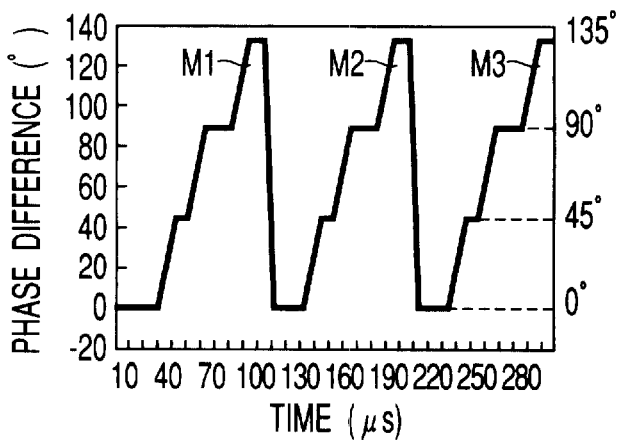
FIG. 20 is a timing chart showing the control pattern of a phase shifter phase difference for obtaining a uniform distribution.

Furthermore, deposition rate distributions with several phase differences were previously measured as shown in FIGS. 18 and 19 and input to the computer 43. On the basis of this data, deposition time ratios corresponding to the individual phase differences necessary to achieve a uniform distribution were calculated to form phase difference change patterns M1, M2, and M3 as shown in FIG. 20. When the phase shifter 42 was controlled by using these phase difference change patterns M1, M2, and M3, film formation was possible by which both the film thickness distribution and the film quality fell within the ranges of ±5% of their respective target values.

When the apparatus was operated by setting the maximum value of high-frequency power to about 800 W which is limited by the rating of the maximum power of the high-frequency amplifier, an average deposition rate of about 2 nm/sec was obtained. Also, as described above, the film thickness distribution of the deposited films cleared ±5% or less necessary for solar cells and thin-film TFTs.

The substrate dimensions used in this embodiment were 46 cm×46 cm. However, even when substrates having the same dimensions of 2.0×1.4 m as in the first embodiment were used, a uniformity of 10% or less could be obtained by a similar method.

Fourth Embodiment

The fourth embodiment of the present invention will be described below with reference to FIG. 21. An apparatus 1D of this embodiment is obtained by partially changing the VHF feeder circuit of the apparatus 1B of the second embodiment described earlier.

A feeder circuit of this apparatus 1D includes two independent high-frequency power supplies 5a and 5b, an oscillator 20D, phase detectors 30a and 30b, a phase-shifting device 33, and a function generator 34. The two power supplies 5a and 5b incorporate amplifiers and independently feed very-high-frequency (VHF) power components having the same frequency of 60 MHz. The phase-shifting device 33 is inserted between the oscillator 20D and the second power supply 5b and shifts the phase of the high frequency fed from the second power supply 5b. Consequently, the high frequency fed from the second power supply 5b to an electrode 303 is so controlled as to have a certain phase difference from the high frequency fed from the first power supply 5a to the electrode 303. The function generator 34 transmits an arbitrary waveform signal to the phase-shifting device 33 and controls a temporal change in the phase difference.

When the oscillator 20D oscillates a VHF wave having a frequency of 60 MHz, one system (a signal S1) of the oscillation signal is directly amplified by the first power supply 5a and input to the first phase detector 30a via a power meter $6a_1$, an isolator 24a, a power meter $6a_2$, and an impedance matching circuit 7a. The phase detector 30a detects the phase of the signal S1, and this signal S1 is supplied to the electrode 303 via a distributor 26a.

The phase of the other system (a signal S2) of the oscillation signal is shifted by the phase-shifting device 33. After that, the signal S2 is amplified by the second power supply 5b and input to the second phase detector 30b via a power meter $6b_1$, an isolator 24b, a power meter $6b_2$, and an impedance matching circuit 7b. The second phase detector 30b detects the phase of the signal S2, and this signal S2 is supplied to the electrode 303 via a distributor 26b.

The phase-shifting device 33 performs feedback control such that the difference between the phase of the signal S1 detected by the first phase detector and the phase of the signal S2 detected by the second phase detector temporally changes in accordance with the phase difference control signal generated by the function generator 34. That is, a temporal change in the phase difference is controlled by the phase-shifting device 33 in accordance with the arbitrary waveform signal generated by the function generator 34. The phase detectors 30a and 30b detect the phase difference between the signals S1 and S2 immediately before the distributors 26a and 26b, respectively. This phase detection signal is supplied to the phase-shifting device 33 to control the phase-shifting operation by feedback.

In this embodiment, if the apparatus is operated with a fixed constant phase difference, an envelope spatially stops to generate a standing wave, and this makes a plasma nonuniform. In contrast, by moving the envelope by changing the phase difference with time, it is possible to suppress a standing wave and obtain a uniform plasma and a uniform film thickness distribution by time average within the film formation time. Note that the isolators 24a and 24b and a protection circuit 22 contribute to stabilization of the power supplies 5a and 5b when they are operated, as in the apparatus 1B described previously.

If the phase difference is modulated too rapidly, the frequency band of a VHF widens to exceed the frequency band width of the isolators 24a and 24b. This may damage these isolators 24a and 24b. Therefore, a spectrum analyzer (not shown) was connected to the phase detectors 30a and 30b to determine the modulation rate such that the band width was 1% or less of the rated frequency.

In this embodiment, the band width did not exceed 1% when modulation was performed by setting the frequency of the phase control signal from the function generator 34 to 10 kHz.

In the present embodiment, the uniformity of deposition rate was within ±8% when the function generator adjusted the modulation width was adjusted to ±110% while the modulation frequency of the phase shifting device was set at 10 kHz.

Fifth Embodiment

Figure 22:
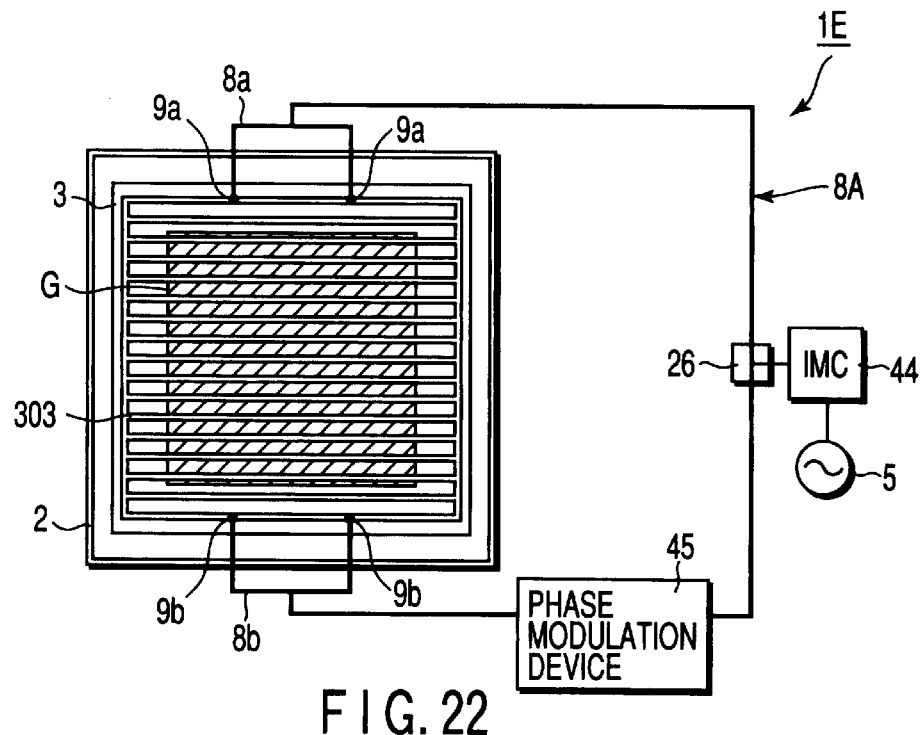
FIG. 22 is a plan block diagram showing a discharge plasma generating apparatus according to the fifth embodiment of the present invention.

The fifth embodiment will be described below with reference to FIG. 22. In this embodiment, a description of the same portions as in the above embodiment will be omitted to avoid duplication.

A high-frequency power supply 5 of a plasma CVD film forming apparatus 1E is connected to a feeder circuit 8B via an impedance matching circuit 44. This feeder circuit 8B branches into two circuits. One branched circuit 8B further branches into two branched circuits 8a which are connected to a ladder electrode 303 via two feeding points 9a. The other branched circuit 8B has a phase modulation device 45. This branched circuit 8B also further branches into two branched circuits 8b which are connected to the ladder electrode 303 via two feeding points 9b. A mechanically driven device having a vacuum capacitor was used as the phase modulation device 45. The same device as in the third embodiment was used as the high-frequency power supply 5.

In this embodiment, feeding points of a multi-point feeding system are divided into two groups. A difference is produced between the phases of high-frequency power components supplied to feeding points of each group, and the high-frequency power components are applied to the ladder electrode 303 via these feeding points. In this manner, the position of an envelope distribution can be controlled.

The apparatus 1E of this embodiment was used to form a-Si films on glass substrates G. The film formation conditions of this embodiment were as follows.

Substrate dimensions: 460 mm×460 mm×1 mm
Substrate temperature: 200° C.
Pressure: 150 mTorr
Process gas: monosilane($SiH_4$)+hydrogen($H_2$)
Gas flow rate: 50 sccm $SiH_4$+1,500 sccm $H_2$
Electrode-to-substrate distance: 10 mm
Electrode dimensions: 520 mm×520 mm×6 mm
Electrode material: stainless steel (JIS SUS304)
Power-supply frequency: 60 MHz
Target film thickness: 1,000 nm Even under the above conditions, film formation rate distributions analogous to those shown in FIGS. 18 and 19 were obtained with phase differences of 0° and 90°. However, the absolute value of the film formation rate was about ⅕.

Films were formed by setting the total film formation time to 6 min and manually controlling the phase difference at 0° for the first three minutes and 90° for the last three minutes. In this embodiment, an average deposition rate of about 0.4 nm/sec was obtained when the apparatus was operated by setting the high-frequency power to about 200 W that was limited by the rating of the phase modulation device. Also, the obtained film thickness distribution was ±15%. These results show that the method of this embodiment can be used in the manufacture of low-cost versatile solar cells.

Sixth Embodiment

Figure 23:
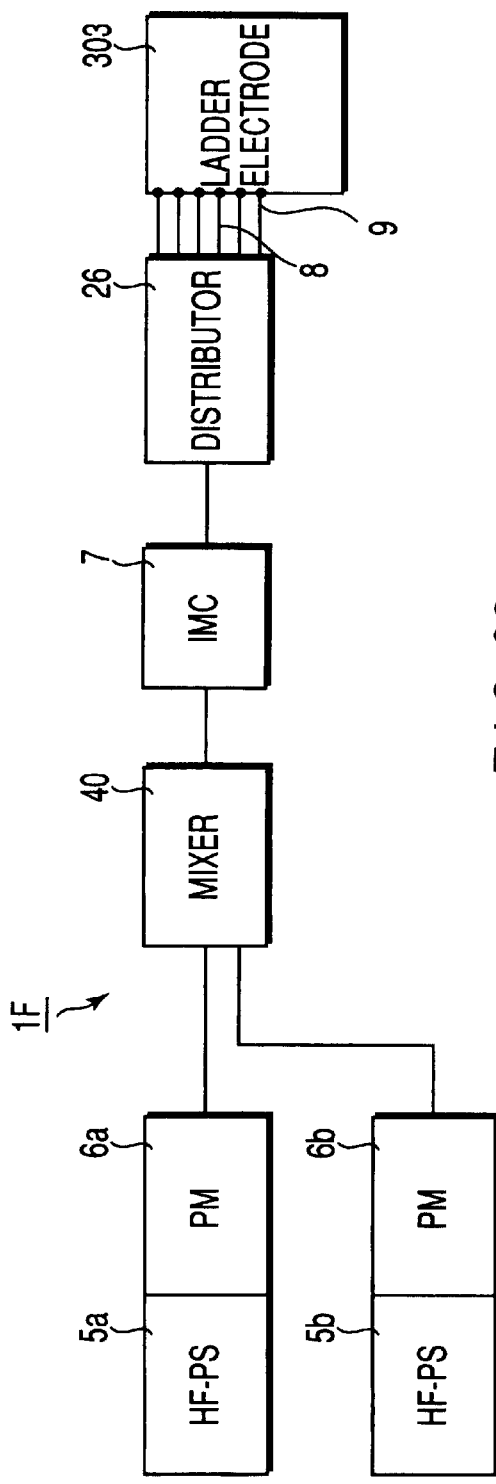
FIG. 23 is a block diagram showing a feeder circuit of a discharge plasma generating apparatus according to the sixth embodiment of the present invention.

The sixth embodiment of the present invention will be described below with reference to FIG. 23. An apparatus 1F of this embodiment is obtained by partially changing the VHF feeder circuit of the apparatus 1A of the first embodiment.

A feeder circuit of this apparatus 1F comprises two independent power supplies 5a and 5b, two independent power meters 6a and 6b, a mixer 40, an impedance matching circuit 7, and a distributor 26. The independent power supplies 5a and 5b output VHF power components having different frequencies. The mixer 40 mixes these VHF power components, and the mixed VHF power is supplied to a ladder electrode 303 via the impedance matching circuit 7 and the distributor.

In this embodiment, a film thickness uniformity of ±10% or less could be obtained regardless of the simplicity of the feeder circuit. Note that in this embodiment the maximum value of power is limited to 2 kW by the rating of the mixer 40.

Seventh Embodiment

Figure 24:
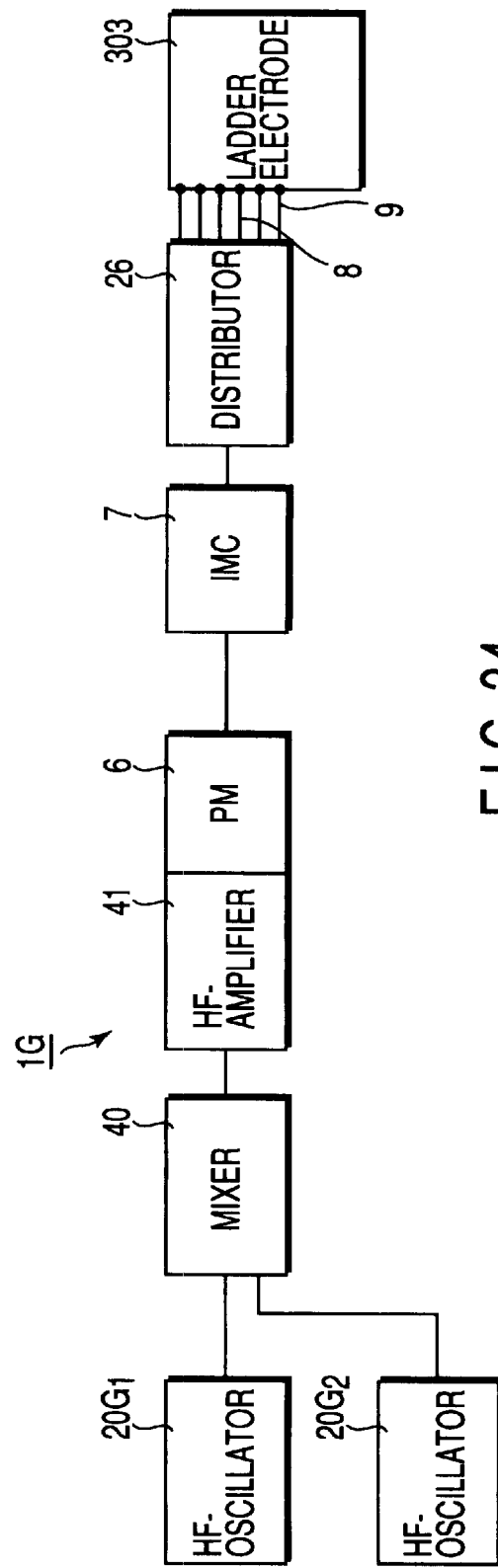
FIG. 24 is a block diagram showing a feeder circuit of a discharge plasma generating apparatus according to the seventh embodiment of the present invention.

The seventh embodiment of the present invention will be described below with reference to FIG. 24. An apparatus 1G of this embodiment is obtained by partially changing the VHF feeder circuit of the apparatus 1F of the above sixth embodiment.

A feeder circuit of this apparatus 1G comprises two independent high-frequency generators $20G_1$ and $20G_2$, a mixer 40, a high-frequency amplifier 41, a power meter 6, an impedance matching circuit 7, and a distributor 26. The independent high-frequency oscillators $20G_1$ and $20G_2$ oscillate different VHFS. These VHFs are mixed by the mixer 40, amplified by the amplifier 41, and supplied to a ladder electrode 303 via the power meter 6, the impedance matching circuit 7, and the distributor 26.

Also in this embodiment, a film thickness uniformity of ±10% or less could be obtained regardless of the simplicity of the feeder circuit. The arrangement of feeding points in this embodiment could be the same as in the sixth embodiment. On the other hand, in this embodiment the maximum value of power was not restricted by the rating of the mixer 40, and film deposition was possible at 4 kW.

Eighth Embodiment

Figure 25:
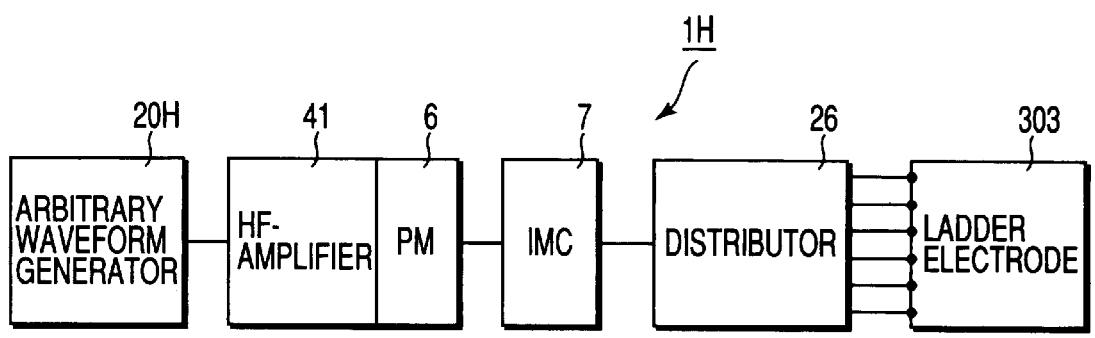
FIG. 25 is a block diagram showing a feeder circuit of a discharge plasma generating apparatus according to the eighth embodiment of the present invention.

The eighth embodiment of the present invention will be described below with reference to FIG. 25. An apparatus 1H of this embodiment is obtained by partially changing the VHF feeder circuit of the apparatus 1G of the above seventh embodiment. In the seventh embodiment, the mixer 40 mixes two signals having different frequencies oscillated by the two high-frequency oscillators, thereby generating a multiple high frequency which is a mixture of plurality of frequencies. In this embodiment, the same effect can be obtained by using one arbitrary waveform generator 20H.

Figure 26A:
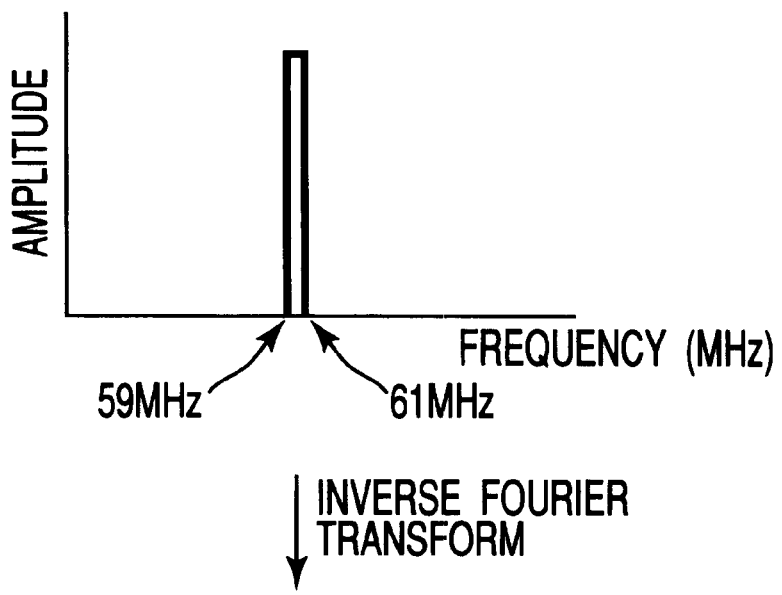
FIG. 26A is a graph showing an example of a frequency spectral distribution used to generate an arbitrary wavelength in implementing a method (a two-frequency method) of applying two or more high frequencies to the same electrode by using an arbitrary waveform generator.
Figure 26B:
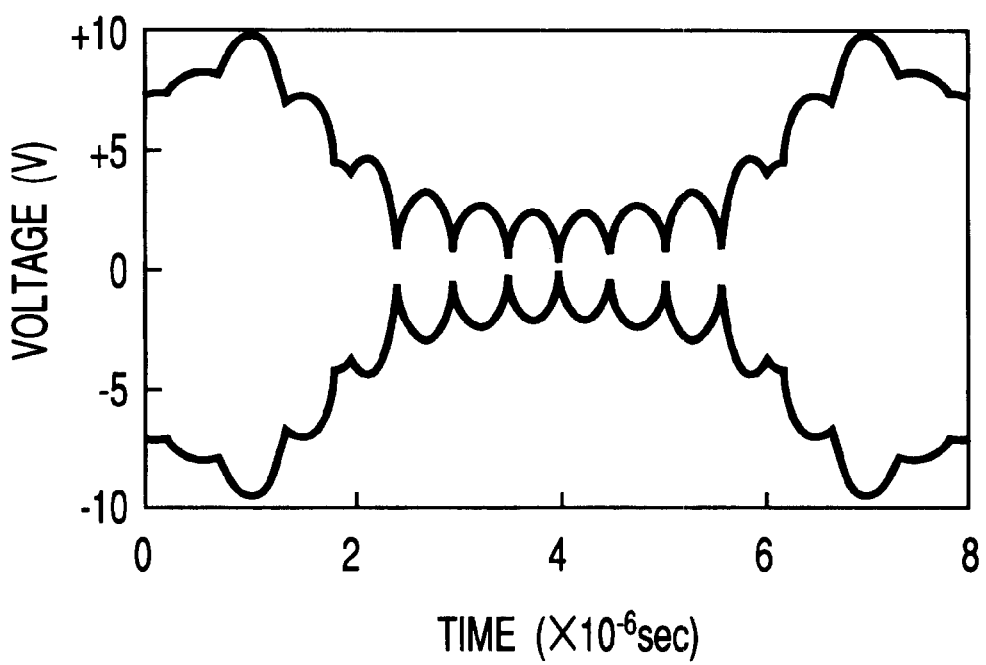
FIG. 26B is a graph showing the envelope of a temporal change in the voltage generated by the arbitrary waveform generator, which is generated on the basis of the frequency spectral distribution.

FIG. 26A is a graph of a frequency spectral waveform showing a multiple high frequency in a frequency band of 59 to 61 MHZ. In FIG. 26A, the frequency (MHz) is plotted on the abscissa, and the amplitude is plotted on the ordinate. First, this frequency spectrum was converted into a temporally changing waveform by performing inverse Fourier transform by using a computer (not shown). The result is shown in FIG. 26B. That is, FIG. 26B is a graph showing the waveform obtained by performing inverse Fourier transform for the multiple high frequency shown in FIG. 26A. In FIG. 26B, the time elapsed ($\times 10^{-6}$ sec) from the beginning of VHF oscillation is plotted on the abscissa, and the voltage (V) on the electrode is plotted on the ordinate. FIG. 26B shows an envelope which contains a wave of about 60 MHz, although details of the waveform are not shown. That is, this waveform contains waves at different frequencies of 59 to 61 MHz. This waveform is stored in the arbitrary waveform generator 20H and repetitively generated from it. Consequently, a multiple high-frequency wave containing frequencies of 59 to 61 MHz is continuously supplied to a high-frequency amplifier 41. This high-frequency wave is then supplied to a ladder electrode 303 via a power meter 6, an impedance matching circuit 7, and a distributor 26. Also in this embodiment, a film thickness uniformity of ±10% or less could be obtained as in the seventh embodiment described above.

Ninth Embodiment

Figure 27:
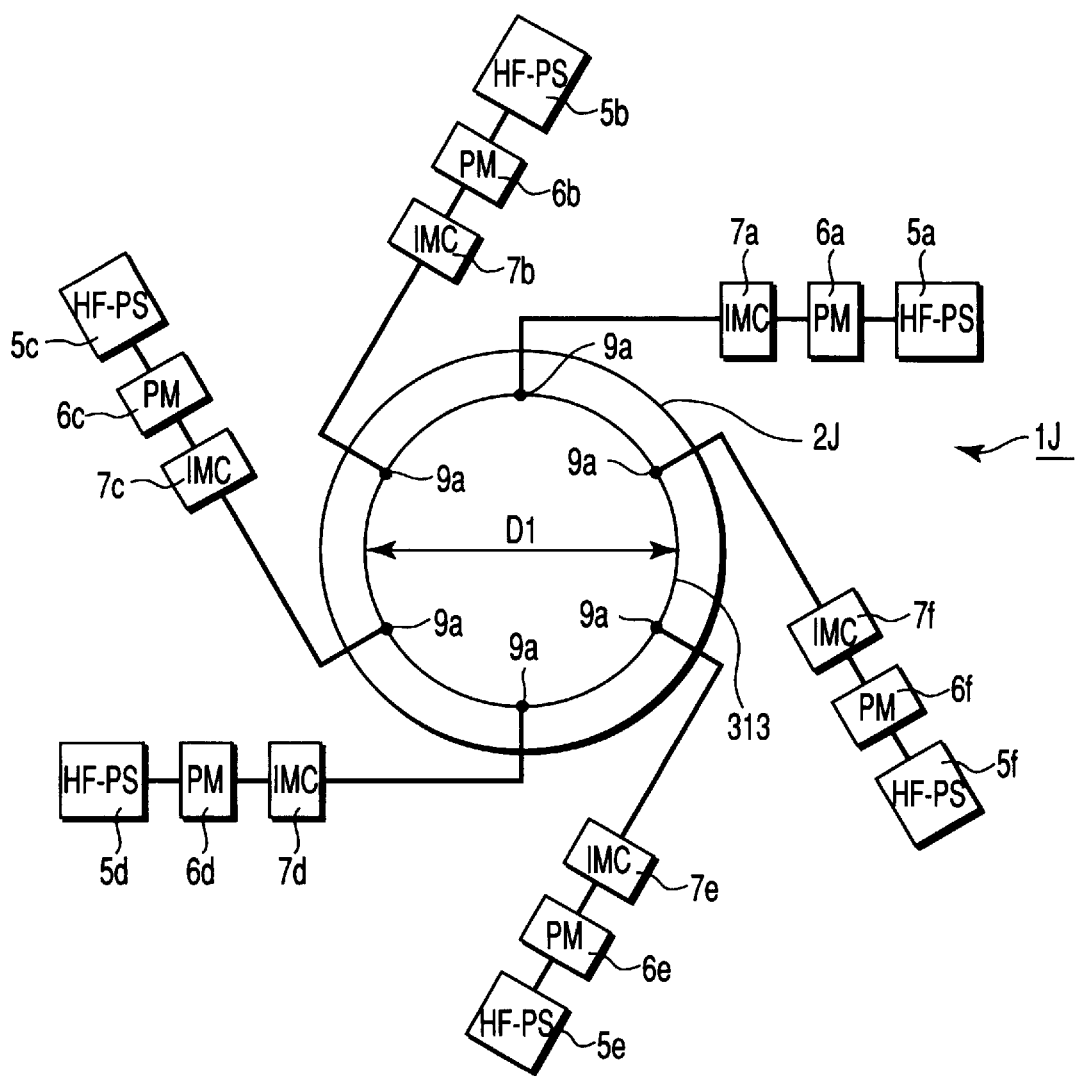
FIG. 27 is a plan block diagram showing a discharge plasma generating apparatus according to the ninth embodiment of the present invention.

The ninth embodiment of the present invention will be described below with reference to FIG. 27. An apparatus 1J of this embodiment includes a circular parallel plate electrode 313 in a vacuum chamber 2J. Six VHF feeder circuits are connected to this parallel plate electrode 313 via six feeding points 9a. The six feeding points 9a are connected to the circular parallel plate electrode 313 by point symmetry. The six VHF feeder circuits are independent of one another. The first VHF feeder circuit includes a high-frequency power supply 5a, a power meter 6a, and an impedance matching circuit 7a. Analogously, the second to sixth VHF feeder circuits include high-frequency power supplies 5b to 5f, power meters 6b to 6f, and impedance matching circuits 7b to 7f, respectively.

In this embodiment, a plasma on the parallel plate electrode 313 could be uniformized by supplying high-frequency waves having different frequencies from the six independent feeder circuits. A film thickness uniformity of ±10% or less could be obtained by adjusting the VHF power and the electrode spacing. However, the range of uniformization conditions of the circular parallel plate electrode 313 is narrower than that of the ladder electrode 303. In this embodiment, the aforementioned uniformity could be obtained only at a power of 2.0 to 2.2 kW and an electrode spacing of 25 to 30 mm.

10th Embodiment

Figure 28:
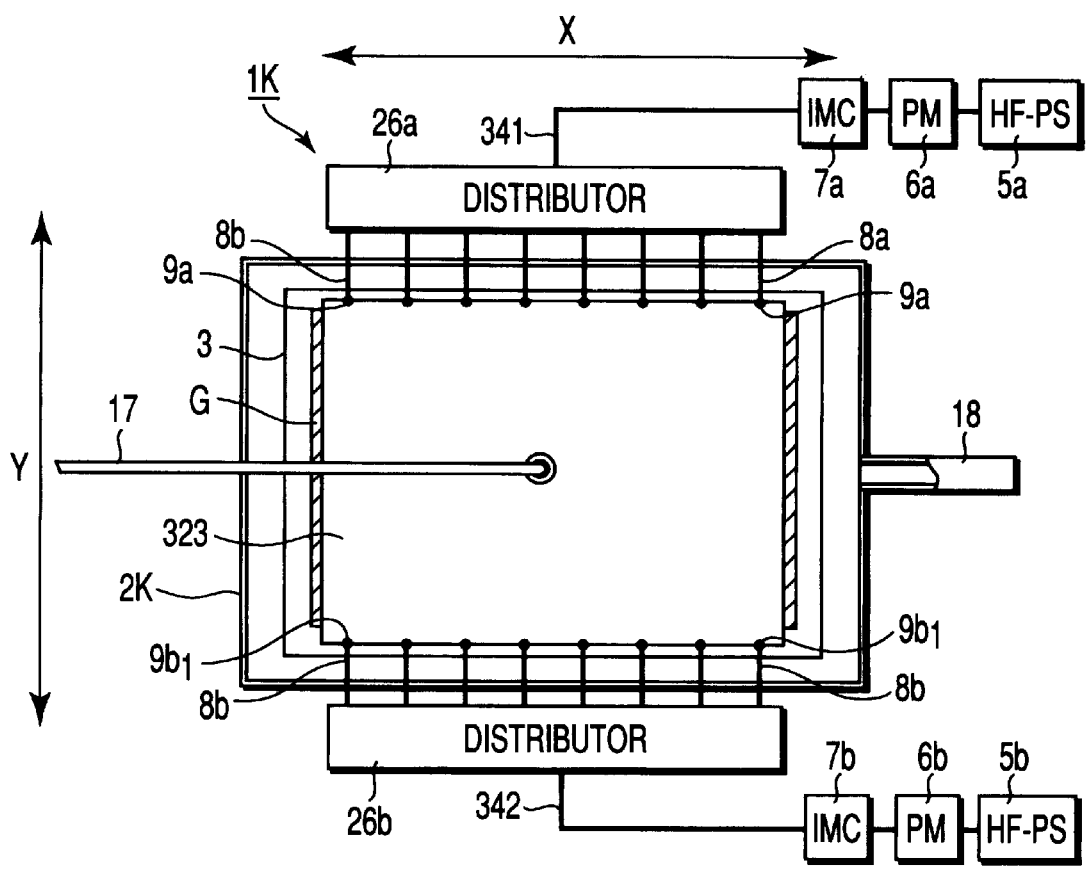
FIG. 28 is a plan block diagram showing a discharge plasma generating apparatus according to the 10th embodiment of the present invention.
Figure 29:
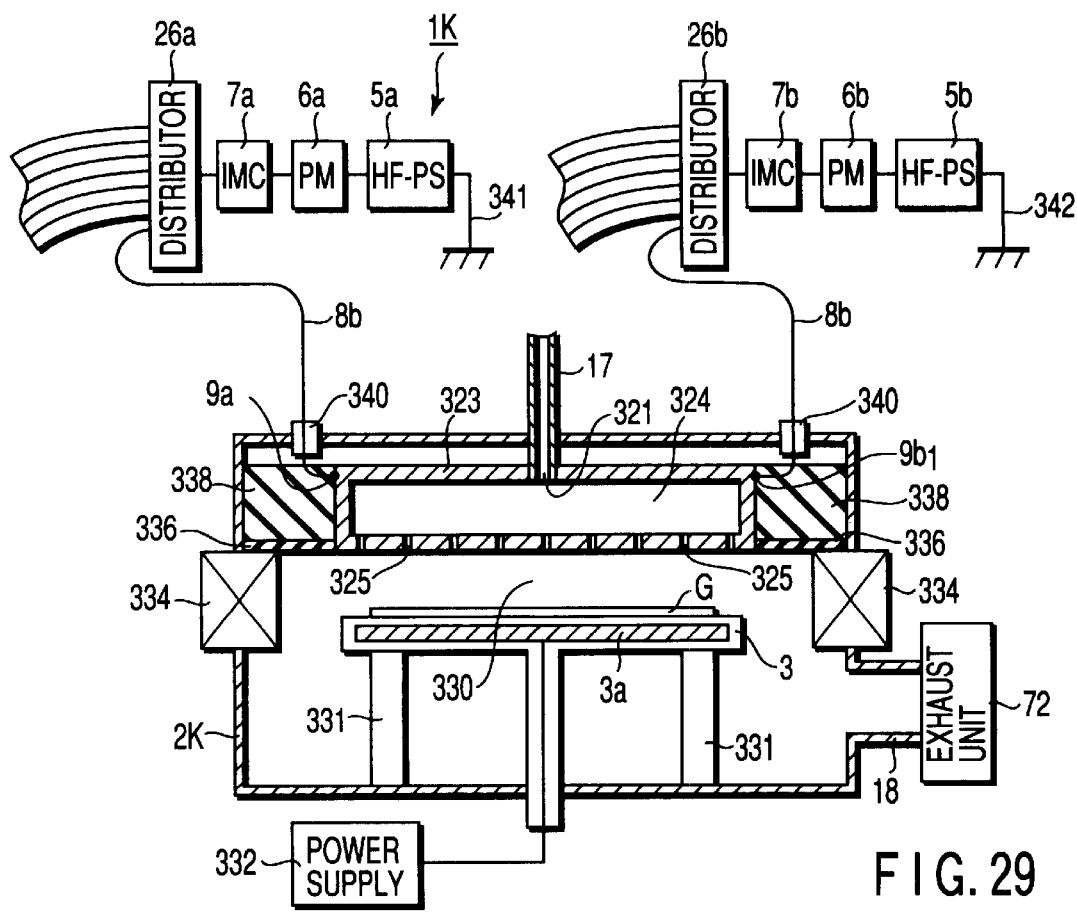
FIG. 29 is a sectional block diagram showing the apparatus of the 10th embodiment.
Figure 30:
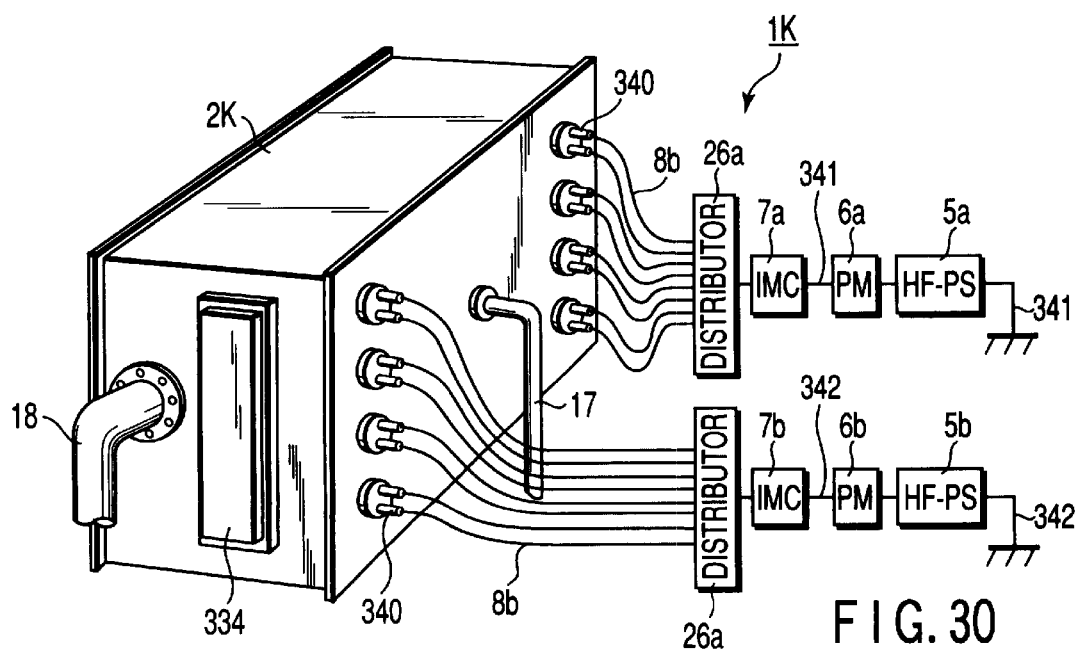
FIG. 30 is a perspective block diagram showing the apparatus of the 10th embodiment.
Figure 32:
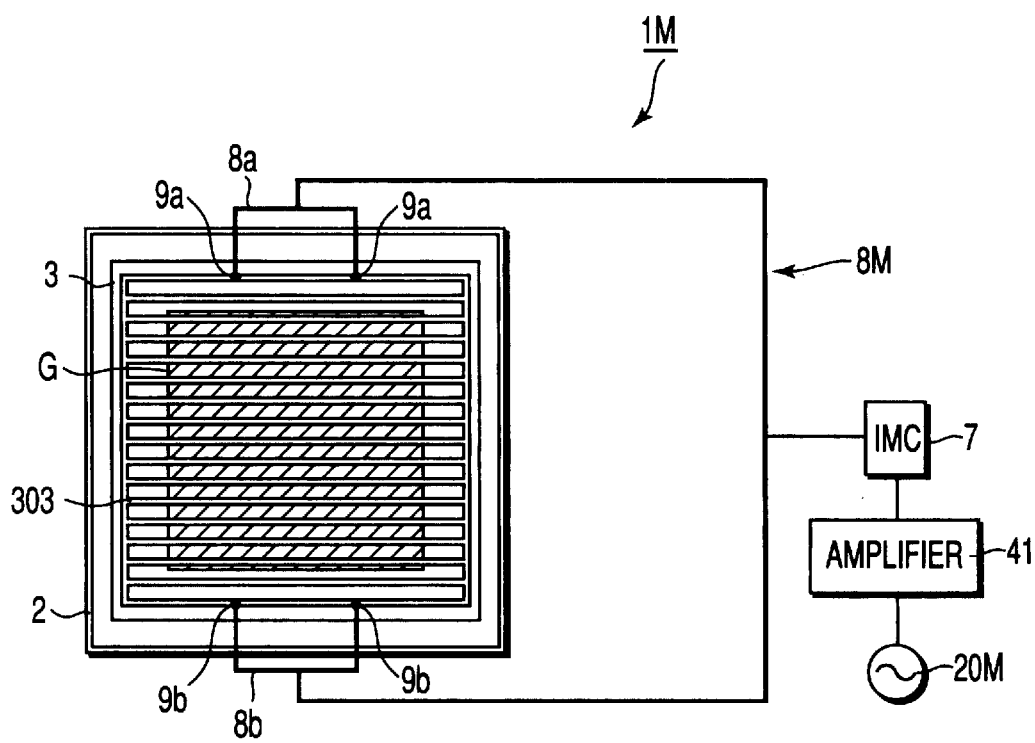
FIG. 32 is a plan block diagram showing a discharge plasma generating apparatus according to the 12th embodiment of the present invention.
Figure 33:
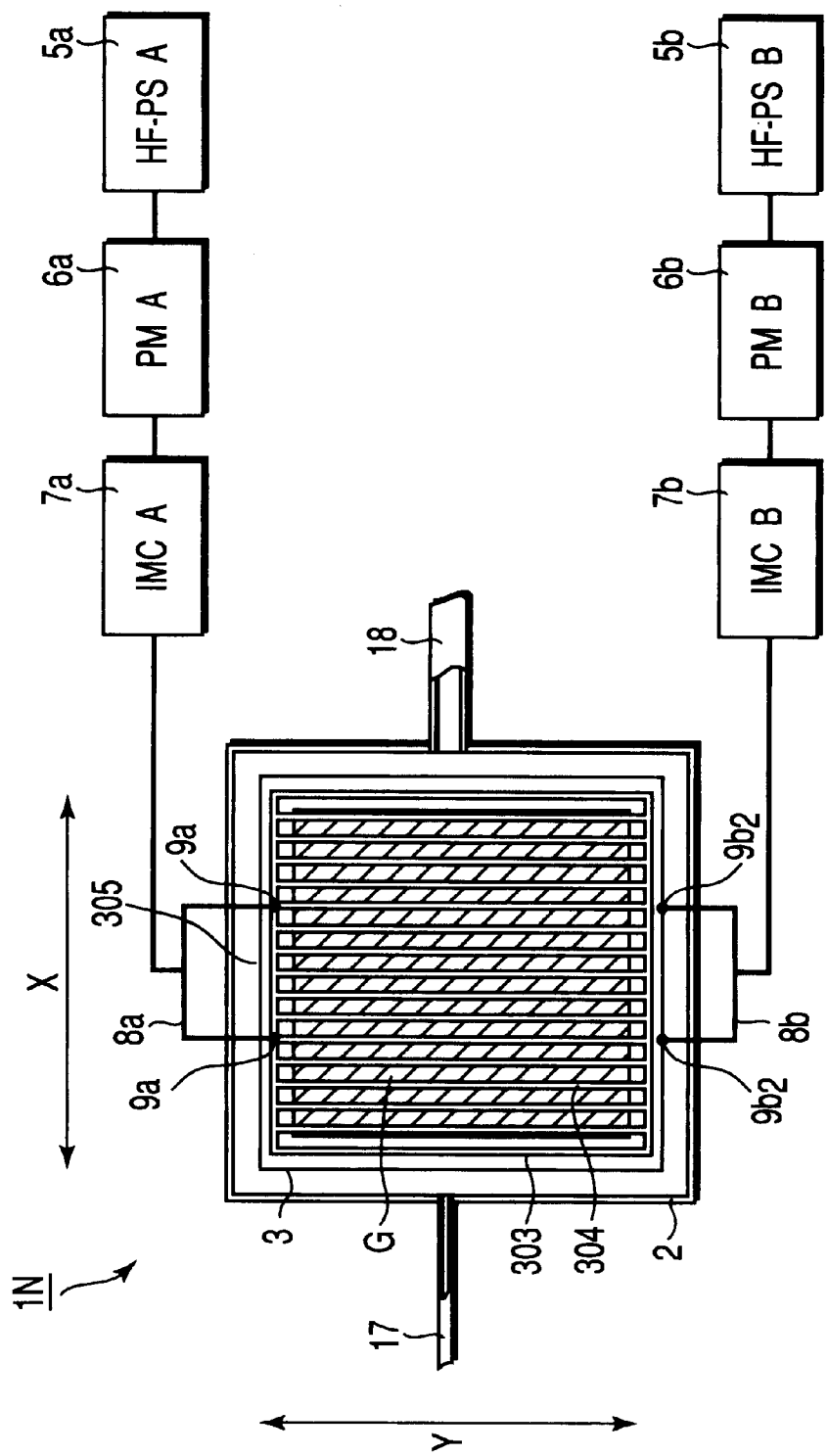
FIG. 33 is a plan block diagram showing a discharge plasma generating apparatus according to the 14th embodiment of the present invention.

The 10th embodiment of the present invention will be described below with reference to FIGS. 28, 29, and 30. FIG. 28 is a plan block diagram showing an apparatus of this embodiment. FIG. 32 is a sectional block diagram showing the apparatus of this embodiment. FIG. 33 is a perspective block diagram showing the external appearance of the apparatus of this embodiment. An apparatus 1K of this embodiment includes a shower type parallel plate electrode 323, instead of the ladder electrode 303 of the apparatus 1A of the first embodiment. A gas supply pipe 17 is connected to the upper surface of this electrode 323. This gas supply pipe 17 communicates with a hollow portion 324 in the electrode via a port 321. The hollow portion 324 communicates with a discharge plasma generation space 330 via a plurality of pores 325.

The electrode 323 is held on the side walls of a chamber 2K by insulating members 336 and 338. Coaxial cables 8b of two feeder circuits 341 and 342 are introduced into the chamber 2K and connected to the electrode 323 via a plurality of feeding points 9a and a plurality of feeding points $9b_1$, respectively. Insulating members 340 insulate portions where the cables 8b extend through the walls of the chamber 2K.

The feeder circuit 341 includes a high-frequency power supply 5a, a power meter 6a, an impedance matching circuit 7a, and a distributor 26a. The distributor 26a feeds power to the feeding points 9a via the eight branched cables 8b. The feeder circuit 342 includes a high-frequency power supply 5b, a power meter 6b, an impedance matching circuit 7b, and a distributor 26b. The distributor 26b feeds power to the feeding points $9b_1$ via the eight branched cables 8b.

A ground electrode 3 is supported by a plurality of columns 331 so as to oppose parallel to the shower electrode 323. A pair of gate valves 334 are formed in the side surfaces of the chamber 2K to allow a substrate G to be loaded/unloaded into/from the chamber 2K. When the gate valves 334 are opened, a loader (not shown) loads the substrate G into the chamber 2K and places the substrate G on the ground electrode 3. A heater 3a connected to a power supply 332 is embedded in the ground electrode 3 and heats the substrate G.

An exhaust pipe 18 communicates with an appropriate portion of the chamber 2K. An evacuation device 72 evacuates the chamber 2K to a high vacuum degree.

The apparatus 1K of this embodiment was used to form films on the substrates G under the same conditions as in the first embodiment. Consequently, in this embodiment a film thickness uniformity of ±12% or less could be obtained. In the apparatus 1K of this embodiment, when the arrangement of the feeding points was changed, the film thickness uniformity largely changed accordingly. Therefore, it was necessary to optimize the feeder distribution center arrangement.

11th Embodiment

Figure 31:
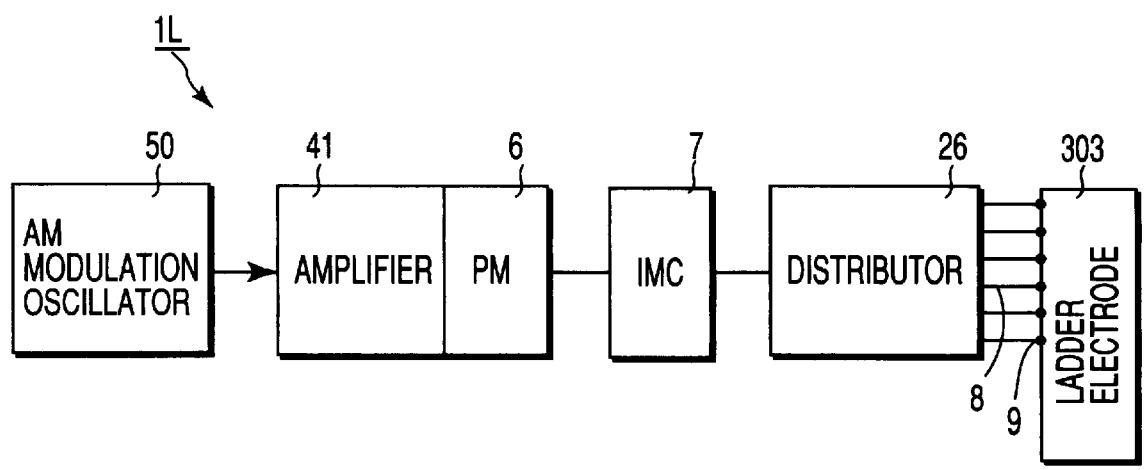
FIG. 31 is a block diagram showing a feeder circuit of a discharge plasma generating apparatus according to the 11th embodiment of the present invention.

The 11th embodiment of the present invention will be described below with reference to FIG. 31. An apparatus 1L of this embodiment is obtained by partially changing the very-high-frequency (VHF) feeder circuit of the apparatus 1A of the first embodiment shown in FIG. 8.

This apparatus 1L comprises an AM modulation oscillator 50, an amplifier 41, a power meter 6, an impedance matching circuit 7, and a distributor 26. A high-frequency wave from the AM modulation oscillator 50 was amplified by the amplifier 41 to generate an AM-modulated high-frequency wave having a carrier frequency of 60 MHz, a modulation frequency of 30 MHz, and a modulation amplitude range from 100% to 20%. This AM-modulated high-frequency wave was fed to a ladder electrode 303 via the power meter 6, the impedance matching circuit 7, and the distributor 26.

In this embodiment, a film thickness distribution of ±15% could be obtained regardless of the simplicity of the circuit.

12th Embodiment

The 12th embodiment will be described below with reference to FIG. 32. In this embodiment, a description of the same portions as in the above embodiments will be omitted to avoid duplication.

A plasma CVD apparatus 1M has a high-frequency oscillator 20M with an FM modulation function as a power supply. An arbitrary waveform generator was used as this high-frequency oscillator 20M. An amplifier 41 and an impedance matching circuit 7 are connected in series to the high-frequency oscillator 20M. An output circuit of the impedance matching circuit 7 branches into two circuits, and each branched circuit 8M further branches into two circuits. These branched circuits 8a and 8b are connected to an electrode 303 via a pair of feeding points 9a and a pair of feeding points 9b, respectively.

In this embodiment, the use of FM modulation made it possible to simplify the feeder circuit and uniformize the film thickness as in the above embodiments. That is, a film thickness uniformity of ±10% or less was obtained on a 10 cm×10 cm square substrate by setting the oscillation frequency to 200 MHz, the modulation frequency to 1 MHz, and the maximum deviation amount to 20%. This film thickness uniformity was much superior to a film thickness uniformity of ±50% obtained by the conventional method.

Similar effects were also obtained by frequency chirp. That is, the film thickness uniformity was ±12% when the chirp frequency was 10 MHz and the maximum deviation amount was 20%.

13th Embodiment

A thin semiconductor film, thin metal film, or insulating film of a semiconductor element can be etched by generating a plasma by using a halogen-based gas, e.g., a chlorine-based gas, thereby generating negative chlorine ions ($Cl^-$). In this case, as described in S. Samukawa, "Role of Negative Ions in High-Performance Etching Using Pulse-Time-Modulated Plasma", Extended Abstract of 4th International Conference on Reactive Plasma, SR 1.04, p. 415, 1998 (to be referred to as reference 8 hereinafter), a plasma is conventionally generated and extinguished by turning on/off electric power generated from a high-frequency power supply, thereby generating a large amount of negative chlorine ions by the electron adhesion effect when the plasma disappears. In addition to this effect, the rate and quality of etching are increased by using the effect of disappearance of the wall electric charge generated on the substrate surface. In this embodiment, a plasma is turned on/off by moving the nodes and antinodes of an envelope.

The apparatus 1B of the second embodiment shown in FIG. 14 was used. Two different frequencies of 750.000 and 750.004 MHz were used to set the frequency difference at 4 kHz, and the electrode dimensions were set to 33 cm×33 cm. In addition, a halogen-based gas, e.g., a chlorine-based gas was used to generate a plasma to generate negative chlorine ions ($Cl^-$), thereby etching a thin Au film on the substrate surface. In this state, the plasma was ON in the antinodes of an envelope distribution and OFF in its nodes. Therefore, etching could be performed at high rate by efficiently and simply generating a large amount of negative chlorine ions by rapidly moving the envelope.

Since the frequency difference was 4 kHz, the changing cycle of the envelope was set to about 250 μsec so that the cycle was longer than, i.e., twice to four times, a negative chlorine ion generation time of about 100 μsec described in reference 10. That is, the plasma turns on/off at a cycle equivalent to the reciprocal of the frequency difference between a plurality of high frequencies. Accordingly, the plasma OFF time was about 125 μsec, so sufficient negative ions are generated.

The etching conditions of this embodiment were as follows:

Substrate dimensions: 300 mm×300 mm×0.5 mm
Substrate temperature: 80° C.
Pressure: 2 mTorr
Etching gas: $Cl_2$
Gas flow rate: 50 sccm
Electrode-to-substrate distance: 20 mm
Electrode dimensions: 330 mm×330 mm×5 mm
Electrode material: stainless steel (JIS SUS304)
Power-supply frequencies: 750.000 MHz, 750.004 MHz
Target etching rate: 3 nm/sec Since 750 MHz was used as the frequency of a high-frequency wave, the plasma density became higher than when 13.56 MHz of the conventional method was used, and simultaneously the thickness of the plasma sheath decreased. Consequently, a large amount of negative chlorine ions generated in the plasma efficiently flowed into the substrate surface, and this further raised the etching rate.

In this embodiment, it was possible to obtain an etching rate about 40 times that obtained when a conventional single frequency of 13.56 MHz was used.

The method of this embodiment is also applicable to so-called self-cleaning which removes foreign matter (thin silicon-based films) sticking to the chamber inner walls of a PCVD apparatus by using a discharge plasma.

The effect of this embodiment is obtained by moving an envelope by using the frequency difference between two frequencies. However, the same effect can naturally be obtained by another envelope moving method, e.g., a phase difference change, AM modulation, or FM modulation.

14th Embodiment

The 14th embodiment of the present invention will be described below with reference to FIG. 33.

An apparatus 1N of this embodiment is obtained by changing the feeding points and high frequencies of the apparatus 1A of the first embodiment.

This apparatus 1N includes first and second high-frequency power supplies 5a and 5b, two feeding points 9a attached to a ladder electrode 303, and two feeding points $9b_2$ attached to a ground electrode 3. The first power supply 5a supplies high-frequency power at a frequency of 60.00 MHz to the ladder electrode 303 via the feeding points 9a. The second power supply 5b supplies high-frequency power at a frequency of 13.56 MHz to the ground electrode 3 via the feeding points $9b_2$.

This embodiment was applied to silicon film etching using halogen-based gas $NF_3$. Consequently, a high etching rate (about 10 nm/sec) was uniformly obtained in a large area of 1 m×1 m by the high density resulting from a very high frequency of 60 MHz, by the substrate bias effect obtained by 13.56 MHz, and by the effect of suppressing a standing wave obtained by the difference between the two frequencies.

This embodiment can also be applied to a surface treatment method such as plasma cleaning of a reaction vessel used in the formation of a thin silicon film, i.e., so-called self-cleaning.

15th Embodiment

Figure 34:
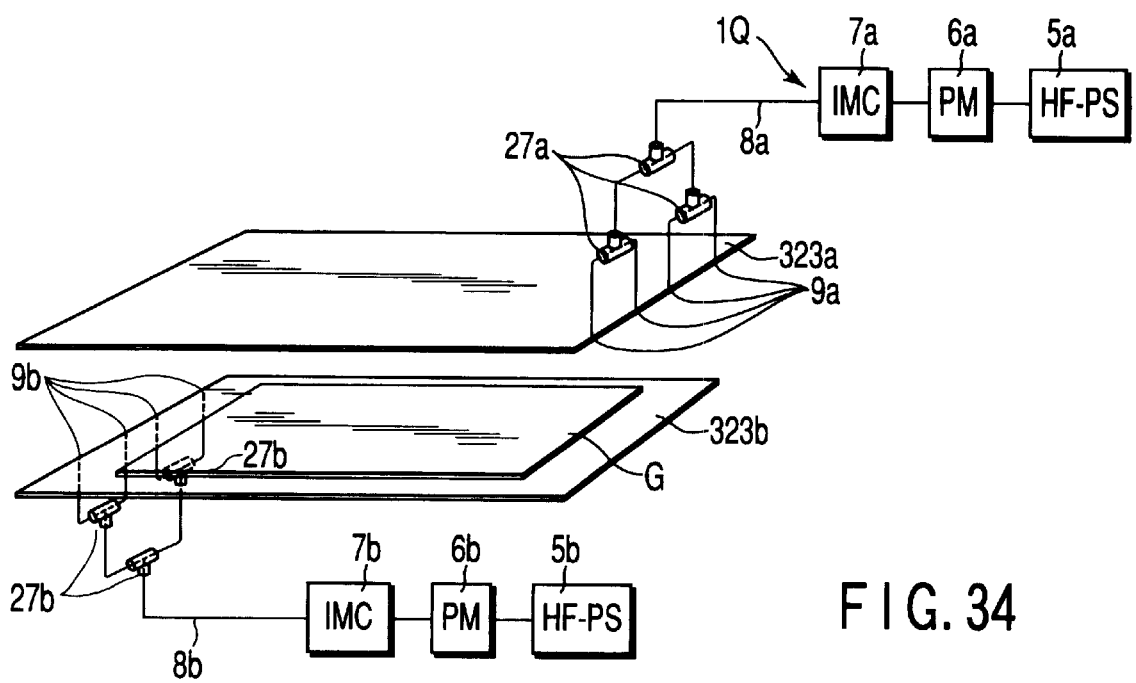
FIG. 34 is a perspective block diagram showing a feeder circuit of a discharge plasma generating apparatus according to the 15th embodiment of the present invention.

The 15th embodiment of the present invention will be described below with reference to FIG. 34. An apparatus 1Q of this embodiment includes upper and lower discharge electrodes 323a and 323b in place of the ground electrode 3 of the apparatus 1K of the 10th embodiment described earlier. These upper and lower electrodes 323a and 323b are flat plates having substantially the same size and arranged parallel to each other. Four first feeding points 9a are formed in a side portion of the upper electrode 323a. An impedance matching circuit 7a, a power meter 6a, and a high-frequency power supply 5a are connected to these four first feeding points 9a via a coaxial cable 8a and a T-shaped branched connector 27a. Four second feeding points 9b are formed in a side portion of the lower electrode 323b. An impedance matching circuit 7b, a power meter 6b, and a high-frequency power supply 5b are connected to these four second feeding points 9a via a coaxial cable 8b and a T-shaped branched connector 27b. The four first feeding points 9a are attached at substantially equal intervals to a short edge on one side of the upper electrode 323a. The four second feeding points 9b are attached at substantially equal intervals to a short edge on the other side of the lower electrode 323b. Accordingly, the four second feeding points 9b are symmetrically positioned on the side far away from the four first feeding points 9a.

In the apparatus 1Q of this embodiment, when a VHF is fed from the power supply 5b to the lower electrode 323b via the four second feeding points 9b, the lower electrode 323b generates a voltage similar to the voltage distribution R1 shown in FIG. 10A in the first embodiment. When a VHF is fed from the power supply 5a to the upper electrode 323a via the four first feeding points 9a, the upper electrode 323a generates a voltage similar to the voltage distribution R2 shown in FIG. 10B. Therefore, on a substrate G a voltage distribution analogous to the synthetic voltage distribution R3 of the two voltage distributions R1 and R2 is generated. This synthetic voltage distribution R3 is highly uniform and generates a plasma having a substantially uniform distribution density, so the uniformity of the film thickness improves. A high film formation rate of 0.9 nm/sec was obtained in nanocrystalline film formation, and the uniformity was about ±10%. That is, the uniformity necessary for S1 thin-film semiconductors for solar cells was achieved.

Comparative examples in which amorphous silicon films (a-Si films) were formed on substrates by using conventional feeding methods will be described below.

Comparative Example 1

Figure 35:
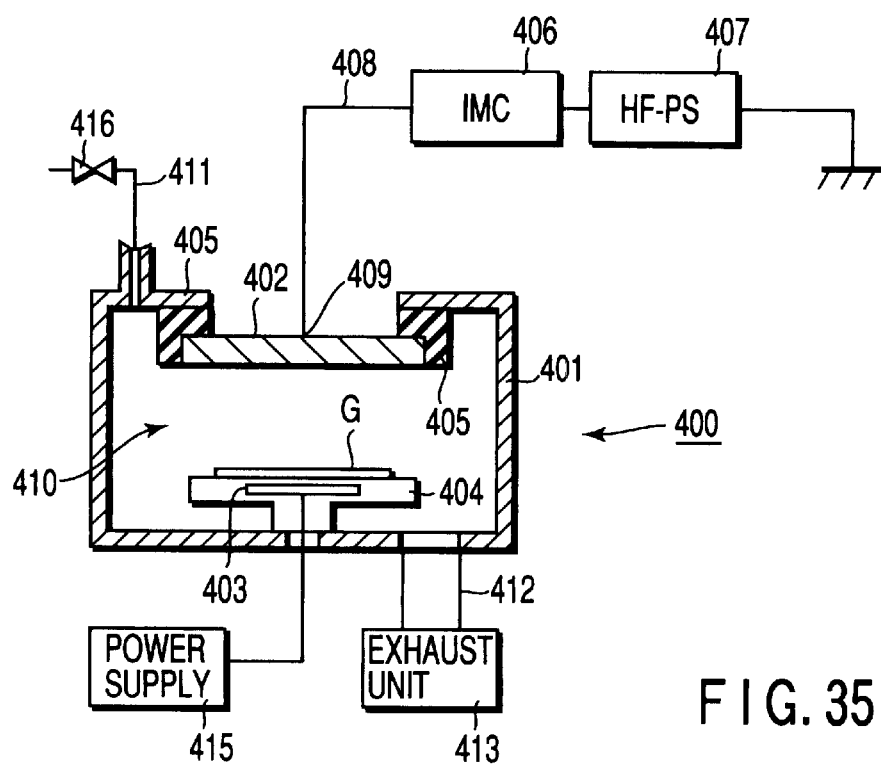
FIG. 35 is a sectional block diagram showing an outline of an apparatus used in a method of Comparative Example 1.

In Comparative Example 1, a parallel plate plasma CVD apparatus 400 shown in FIG. 35 was used. This apparatus 400 is known by the reference 1 cited previously. Upper and lower electrodes 402 and 404 are opposed in a vacuum vessel 401. The upper electrode 402 is mounted on the upper portion of the vacuum vessel 401 via an insulator 405. This upper electrode 402 is connected to an impedance matching circuit 406 and a high-frequency power supply 407 via a coaxial cable 408. The power-supply frequency is 13.56 MHz. The cable 408 is connected to the upper electrode 402 by a feeder distribution center 409. This feeder distribution center 409 is formed on the surface (outer surface) exposed to the atmosphere of the upper electrode 402 so as not to be exposed in a plasma generation space 410.

The lower electrode 404 houses a heater 403 for heating a substrate G. A heater power supply is controlled by a controller (not shown). The substrate G is placed on the lower electrode 404 and heated to a predetermined temperature by the heater 403. Note that the lower electrode 404 is grounded.

A gas supply pipe 411 is open in the upper portion of the vacuum vessel 401. This gas supply pipe 411 communicates with a gas supply source (not shown) via a flow rate control valve 416. The gas supply source contains monosilane ($SiH_4$). An exhaust pipe 412 is open in the lower portion of the vacuum vessel 401. This exhaust pipe 412 communicates with a vacuum pump 413.

The above apparatus 400 was used to form a-Si films on glass substrates. The film formation conditions of Comparative Example 1 were as follows.

Substrate dimensions: 1,200 mm×1,000 mm×1 mm
Substrate temperature: 200° C.
Pressure: 0.05 to 0.5 Torr
Process gas: monosilane ($SiH_4$)
Gas flow rate: 100 sccm
Electrode-to-substrate distance: 30 mm
Electrode dimensions: 1,300 mm×1,100 mm×50 mm
Electrode material: stainless steel (JIS SUS304)
Power-supply frequency: 13.56 MHz
Target film thickness: 1,000 nm As a consequence, a-Si films having a variation of ±18% with respect to the target film thickness were obtained. The average film formation rate was 0.13 nm/sec.

Comparative Example 2

Figure 36:
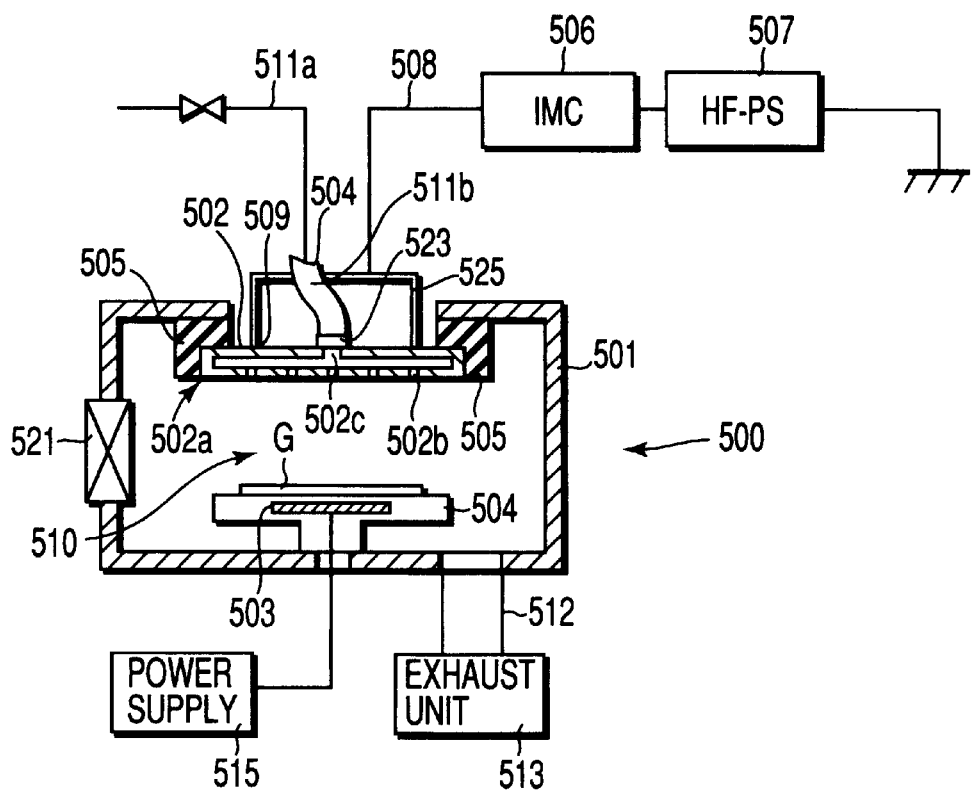
FIG. 36 is a sectional block diagram showing an outline of an apparatus used in a method of Comparative Example 2.
Figure 37:
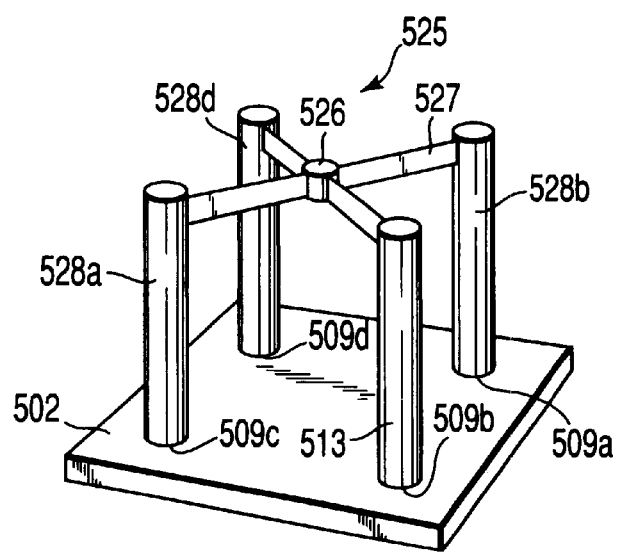
FIG. 37 is a perspective view showing a power distributor of the apparatus shown in FIG. 36.

In Comparative Example 2, a parallel plate plasma CVD apparatus 500 shown in FIGS. 36 and 37 was used. This apparatus 500 is known by the reference 1 cited previously.

As Comparative Example 2, the second apparatus described in reference 1 will be explained with reference to FIGS. 36 and 37. In this Comparative Example 2, a description of the same portions as in Comparative Example 1 described above will be omitted to avoid duplication.

Reference numeral 521 denotes a gate valve formed in a side wall of a vacuum vessel 501. A substrate G is loaded/unloaded through this gate valve 521. A hollow non-grounded electrode 502 is placed inside an insulator 505 which is positioned in the upper portion of the vacuum vessel 501. A large number of gas supply holes 502b about 0.5 mm in diameter are formed in a lower surface (front surface) 502a of this non-grounded electrode 502 at intervals of 10 to 15 mm to face a plasma generation space 510. An opening 502c for a discharge gas is formed in the upper surface of the non-grounded electrode 502. A discharge gas supply pipe 511b is connected to this opening 502c of the non-grounded electrode 502 via a connecting member 523. This discharge gas supply pipe 511b supplies, e.g., monosilane gas ($SiH_4$) into the non-grounded electrode 502. A power distributor 525 for branching the output from a high-frequency power supply into a plurality of portions is placed on the non-grounded electrode 502.

A glow discharge plasma is generated in the vacuum vessel 501 by the non-grounded electrode 502 and a grounded electrode 504. The non-grounded electrode 502 is a rectangular or square plate-like member (about 500 mm×500 mm to about 1,000 mm×1,000 mm and 60 mm in thickness) and made of stainless steel. This non-grounded electrode 502 is supplied with necessary power by a power supply system composed of a high-frequency power supply 507, an impedance matching circuit 506, and the power distributor 525 described above.

As shown in FIG. 37, the power distributor 525 is composed of a columnar connection port 526 placed in the center, four band-like branched ports 527 radially extending from the connection port 526, and four columnar members 528a, 528b, 528c, and 528d. Reference numerals 509a, 509b, 509c, and 509d in FIG. 37 denote power supply portions. A gas in the vacuum vessel 501 is exhausted through the exhaust pipe 512 by the vacuum pump 513. A substrate 514 is placed on the grounded electrode 504 by opening the gate valve 521 and heated to a predetermined temperature by a substrate heater 503 and a substrate heater power supply 515.

The above apparatus 500 was used to form a-Si films on glass substrates. The film formation conditions of Comparative Example 2 were as follows.

Substrate dimensions: 350 mm×450 mm×1 mm
Substrate temperature: 200° C.
Pressure: 0.2 Torr
Process gas: monosilane ($SiH_4$)
Gas flow rate: 100 sccm
Electrode-to-substrate distance: 20 mm
Electrode dimensions: 500 mm×500 mm×50 mm
Electrode material: stainless steel (JIS SUS304)
Power-supply frequency: 70 MHz
Target film thickness: 1,000 nm As a consequence, a-Si films having a variation of ±50% with respect to the target film thickness were obtained.

First, the gate valve 521 was opened to place the substrate G on the grounded electrode 504, and the gate valve 521 was closed. The vacuum pump 513 was driven to evacuate the vacuum vessel 501 to an internal pressure of about $1 \times 10^{-7}$ Torr. While the power supply amount from the power supply 515 was controlled, the substrate G was heated to a predetermined target temperature by the heater 503. A predetermined amount of monosilane gas was supplied through the discharge gas supply pipes 511a and 511b, and the internal pressure of the vacuum vessel was held at 0.05 to 0.5 Torr. A high-frequency voltage was applied to the non-grounded electrode 502 by the power supply 507, thereby generating a glow discharge plasma between the non-grounded electrode 502 and the grounded electrode 504.

When the monosilane gas was formed into a plasma, radicals such as $SiH_3$, $SiH_2$, and SiH existing in the plasma diffused by a diffusion phenomenon. These radicals were adsorbed in and deposited on the surface of the substrate G to form an a-Si film.

Comparative Example 3

Figure 38:
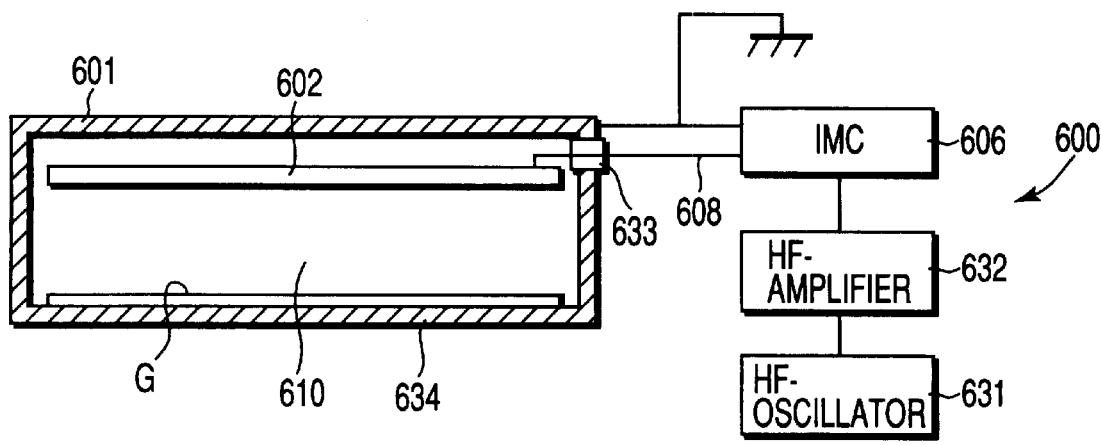
FIG. 38 is a sectional block diagram showing an outline of an apparatus used in a method of Comparative Example 3.
Figure 39:
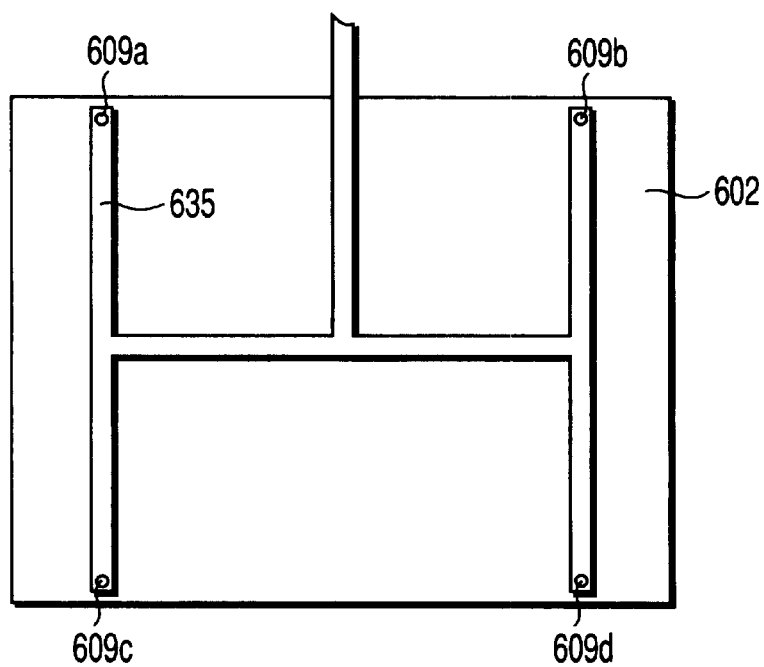
FIG. 39 is a plan view showing an outline of a discharge electrode of the apparatus shown in FIG. 38 and a feeding method.

In Comparative Example 3, a parallel plate plasma CVD apparatus 600 shown in FIGS. 38 and 39 was used. This apparatus 600 is known by reference 2 cited previously.

As Comparative Example 3, the apparatus described in reference 2 will be explained below with reference to FIGS. 38 and 39.

A high-frequency oscillator 631 is connected to an impedance matching circuit 606 via a high-frequency power amplifier 632. The high-frequency oscillator 631 and the high-frequency amplifier 632 constitute a high-frequency power supply. A vacuum current supply terminal 633 is formed on a wall surface 634 of a vacuum vessel 601. A coaxial cable 608 extending through this supply terminal 633 connects a non-grounded electrode 602 and the impedance matching circuit 606. The wall surface 634 of the vacuum vessel 601 is grounded. A substrate G is placed on the wall surface 634. When a gas is supplied into the vacuum vessel 601 and a high frequency is applied between the electrode 502 and the wall surface 634, a glow discharge plasma is generated between them. The non-grounded electrode is supplied with high-frequency power from the power supply 631 via the vacuum current supply terminal 633, the coaxial cable 608, and the impedance matching circuit 606. The frequency of the high-frequency wave oscillated by the power supply 631 is 70 MHz.

As shown in FIG. 39, an H-shaped feeder 635 is formed on the rear surface (the surface not in contact with the plasma generation space) of the electrode 602. Feeding points 609a, 609b, 609c, and 609d are formed at the four corners of this feeder 635.

The above apparatus 600 was used to form a-Si films on glass substrates. The film formation conditions of Comparative Example 3 were as follows.

Substrate dimensions: 350 mm×450 mm×1 mm
Substrate temperature: 200° C.
Pressure: 0.2 Torr
Process gas: monosilane ($SiH_4$)
Gas flow rate: 100 sccm
Electrode dimensions: 470 mm×570 mm
Electrode material: stainless steel (JIS SUS304)
Power-supply frequency: 70 MHz
Target film thickness: 1,000 nm As a consequence, a-Si films having a variation of ±18% with respect to the target film thickness were obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A discharge plasma generating method comprising, the steps of;
   (a) opposing a discharge electrode having a substantially plane discharge portion to a substrate to be processed in a vacuum reaction vessel such that said discharge electrode and said substrate are substantially parallel to each other;
   (b) evacuating said vacuum reaction vessel and supplying a process gas to a space between said discharge electrode and said substrate; and
   (c) applying high-frequency power to said discharge electrode such that an envelope representing the spatial distribution of a high-frequency voltage $\phi$ on said discharge electrode in a split second changes in accordance with a function including time as a parameter, thereby generating a discharge plasma of the process gas between said discharge electrode and said substrate, with substantially no standing wave of the high-frequency voltage $\phi$ generated on said discharge electrode.

2. A method according to claim 1, wherein the step (c) comprises using a plurality of high-frequency power supplies to cause the envelope to change at all times in accordance with the function including time as a parameter.

3. A method according to claim 2, wherein the step (c) comprises:
   connecting a plurality of power supplies for independently oscillating high frequencies to said discharge electrode; and
   supplying high-frequency power from each of said power supplies to said discharge electrode.

4. A method according to claim 2, wherein the step (c) comprises:
   connecting a plurality of power supplies to said discharge electrode; and
   supplying high-frequency power components having different frequencies from said plurality of power supplies to said discharge electrode.

5. A method according to claim 2, wherein the difference between the different oscillation frequencies is not more than 20% of the oscillation frequency of each power supply.

6. A method according to claim 2, wherein the step (c) comprises connecting a plurality of power supplies to said discharge electrode and changing at all times the difference between the phase of a high frequency supplied from one of said plurality of power supplies and the phase of a high frequency supplied from at least one of the other power supplies.

7. A method according to claim 6, wherein the step (c) comprises using a phase shifter as means for changing the phase difference.

8. A method according to claim 7, wherein said phase shifter is inserted between a high-frequency oscillator and an amplifier, said high-frequency oscillator determines the oscillation frequency of a high-frequency signal, and said amplifier amplifies the high-frequency signal from said high-frequency oscillator.

9. A method according to claim 1, wherein a plurality of feeding points are used to feed power to said discharge electrode, said plurality of feeding points being attached to said discharge electrode so as to be symmetrical with respect to a central line or a central point of said discharge electrode.

10. A method according to claim 2, wherein the step (c) comprises using an impedance matching circuit for matching the impedance of said discharge electrode with the impedance of each power supply, and inserting an isolator between said impedance matching circuit and said power supply to reduce input high-frequency power to said power supply from another power supply, thereby protecting said power supply.

11. A method according to claim 2, wherein the step (c) comprises using first and second power supplies, supplying high-frequency power having a first frequency from said first power supply to said discharge electrode, and supplying high-frequency power having a second frequency from said second power supply to said discharge electrode, such that the difference between the first and second frequencies is not more than 4% of the average value of the first and second frequencies.

12. A method according to claim 11, wherein the difference is not more than 1% of the average value of the first and second frequencies.

13. A method according to claim 2, wherein the step (c) comprises limiting an output from one power supply in accordance with the magnitude of high-frequency power incident to another power supply through said discharge electrode.

14. A method according to claim 2, wherein the step (c) comprises inserting a high-frequency mixer between said plurality of power supplies and said discharge electrode, mixing high-frequency power components from said plurality of power supplies by said high-frequency mixer, and supplying the mixed high-frequency power to said electrode.

15. A method according to claim 1, wherein the step (c) comprises changing each hour an envelope generated on said discharge electrode by performing AM modulation, FM modulation, or frequency chirp for high-frequency power oscillated by said power supply.

16. A method according to claim 1, wherein the step (c) comprises previously measuring a plurality of values of at least one of a voltage distribution, plasma generation density distribution, radical generation density distribution, film deposition distribution, etching distribution, and semiconductor film characteristic distribution, with respect to the difference between frequencies, the value of each frequency, the difference between phases, or the range of AM modulation, FM modulation, or frequency chirp, and obtaining a uniform distribution by time average or time integral on the basis of the measurement results by adjusting at least one of the time, period, and frequency of power supply to said discharge electrode with respect to the difference between specific frequencies, the value of each frequency, the difference between phases, or the range of AM modulation, FM modulation, or frequency chirp.

17. A method according to claim 1, wherein the step (c) comprises making the cycle of plasma ON/OFF resulting from a change in the envelope distribution shorter than the extinction life of an active atom, active molecule, or ion in the generated plasma.

18. A method according to claim 17, wherein the cycle is not more than ½ the extinction life of an active atom, active molecule, or ion in the generated plasma.

19. A method according to claim 1, wherein the step (c) comprises making the cycle of plasma ON/OFF resulting from a change in the envelope distribution shorter than at least one of a life $\tau$ of an $SiH_3$ active molecule given by:

$$\tau \approx (\Delta x)^2/(2D)$$

where
  D: a diffusion coefficient ($=2.5 \times 10^3$ ($cm^2$/sec))
  $\Delta x$: the distance (cm) from a discharge electrode to a substrate
and a life, $1.1 \times 10^{-4}$ sec, of a hydrogen atom radical.

20. A method according to claim 19, wherein the cycle is not more than ½ of $\tau$ or not more than ½ of $1.1 \times 10^{-4}$ sec.

21. A method according to claim 1, wherein the step (c) comprises making the cycle of plasma ON/OFF resulting from a change in the envelope distribution longer than, and not more than 10 times, the generation life of an active atom, active molecule, or ion in the generated plasma.

22. A method according to claim 21, wherein the cycle is twice to four times the generation life of an active atom, active molecule, or ion in the generated plasma.

23. A method according to claim 1, wherein the step (c) comprises setting a plasma ON/OFF frequency resulting from a change in the envelope distribution to be in a range of 0.5 Hz (inclusive) to 100 kHz (inclusive), i.e., a plasma ON time resulting therefrom to be in a range of 0.01 msec (inclusive) to 1 sec (inclusive).

24. A method according to claim 23, wherein the ON/OFF frequency is not more than 10 kHz, i.e., the plasma ON time is not more than 0.1 msec.

25. A method according to claim 1, wherein the step (c) comprises making the cycle of plasma ON/OFF resulting from a change in the envelope distribution longer than a discharge region dwell time t of a source gas given by:

$$t \approx (S \cdot \Delta x)/Q$$

where
  S: a substrate area ($cm^2$)
  $\Delta x$: the distance (cm) from a discharge electrode to a substrate
  Q: a volume flow rate ($cm^3$/sec).

26. A method according to claim 25, wherein the cycle is not less than twice the dwell time t.

27. A method according to claim 1, wherein said discharge electrode is a ladder electrode or a mesh electrode.

28. A method according to claim 1, wherein said discharge electrode is a plate-like electrode, and a plate-like counter electrode for supporting said substrate and said discharge electrode are arranged substantially parallel to each other.

29. A method according to claim 2, comprising a first power supply for supplying high-frequency power to said discharge electrode, and a second power supply for supplying high-frequency power to said counter electrode.

30. A method according to claim 1, wherein the frequency of the high-frequency power is 10 to 800 MHz.

31. A method according to claim 2, wherein the difference between frequencies oscillated by said plurality of high-frequency power supplies is 0.1 to 10.0 MHz.

32. A method according to claim 31, wherein the difference is 1.5 to 6.0 MHz.

33. A method according to claim 1, wherein a length L (cm) of said discharge electrode from an incident point to a reflection point of a high frequency satisfies $$2\times10^3/f \leq L \leq 20\times10^3/f$$

where f represents a VHF (MHz).

34. A method according to claim 33, wherein the lower limit of the length L of said discharge electrode is $4\times10^3/f$.

35. A method according to claim 1, wherein the step (c) comprises locally supplying at least one type of a gas selected from the group consisting of hydrogen, argon, neon, helium, and nitrogen to said feeding portion or to parts where suppression of deposition is necessary, thereby suppressing deposition of film formation components and generation of particles in said feeding portion or parts.

36. A semiconductor device fabrication method comprising, the steps of;
(a) loading a substrate to be processed into a vacuum reaction vessel and placing said substrate on a heater electrode such that a discharge electrode having a substantially plane discharge portion and said substrate are substantially parallel to each other;
(b) evacuating said vacuum reaction vessel, supplying a process gas to a space between said discharge electrode and said substrate, and heating said substrate by said heater electrode; and
(c) applying high-frequency power to said discharge electrode such that an envelope representing the spatial distribution of a high-frequency voltage φ on said discharge electrode hour by hour changes in accordance with a function including time as a parameter, thereby generating a discharge plasma of the film formation gas between said discharge electrode and said substrate, with substantially no standing wave of the high-frequency voltage φ generated on said discharge electrode.

37. A method according to claim 36, wherein the step (c) comprises making the cycle of plasma ON/OFF resulting from a change in the envelope distribution shorter than the extinction life of an active atom, active molecule, or ion in the generated plasma.

38. A method according to claim 37, wherein the cycle is not more than ½ the extinction life of an active atom, active molecule, or ion in the generated plasma.

39. A method according to claim 36, wherein the step (c) comprises making the cycle of plasma ON/OFF resulting from a change in the envelope distribution substantially equal to or shorter than a life τ of an SiH₃ active molecule given by:

$$\tau \approx (\Delta x)^2/(2D)$$

where
D: a diffusion coefficient (=$2.5\times10^3$ (cm²s⁻¹))
Δx: the distance (cm) from a discharge electrode to a substrate or substantially equal to or shorter than a life, $1.1\times10^{-4}$ sec, of a hydrogen atom radical.

40. A method according to claim 39, wherein the cycle is not more than ½ of τ or not more than ½ of $1.1\times10^{-4}$ sec.

41. A method according to claim 36, wherein the step (c) comprises locally supplying at least one type of a gas selected from the group consisting of hydrogen, argon, neon, helium, and nitrogen to a feeding portion or to parts where suppression of deposition is necessary, said feeding portion being a portion where said discharge electrode receives high-frequency power from a power supply.

42. A method according to claim 36, wherein
said discharge electrode has dimensions of not less than 500 mm×500 mm,
said substrate is made of glass, and
the step (c) comprises heating said substrate to a temperature of 80° C. to 350° C. by said heater electrode.

43. A method according to claim 36, wherein
said discharge electrode has dimensions of not less than 500 mm×500 mm,
said substrate is made of a metal, and
the step (c) comprises heating said substrate to a temperature of 80° C. to 500° C. by said heater electrode.

44. A method according to claim 36, wherein
said discharge electrode has dimensions of not less than 500 mm×500 mm,
said substrate is made of a resin, and
the step (c) comprises heating said substrate to a temperature of 80° C. to 200° C. by said heater electrode.

45. A method according to claim 36, wherein the step (c) comprises setting the difference between a plurality of high frequencies to 0.1 to 10.0 MHz.

46. A method according to claim 36, wherein the step (c) comprises setting the difference between a plurality of high frequencies to 1.5 to 6.0 MHz.

47. A discharge plasma generating apparatus comprising:
a chamber;
a substrate mounting table for holding a substrate in said chamber;
a discharge electrode opposed to said substrate on said substrate table in said chamber;
exhaust means for evacuating said chamber;
gas supply means for supplying a process gas into said chamber;
a high-frequency power-supply circuit for supplying high-frequency power to said discharge electrode; and
control means for controlling power supply from said high-frequency power-supply circuit to said discharge electrode such that an envelope representing the spatial distribution of a high-frequency voltage φ on said discharge electrode changes each hour in accordance with a function including time as a parameter.

48. An apparatus according to claim 47, wherein said high-frequency power-supply circuit comprises:
a single high-frequency oscillator connecting with said discharge electrode via a plurality of feeding points;
a distributor inserted between said high-frequency oscillator and said discharge electrode to distribute high-frequency power oscillated by said high-frequency oscillator to said plurality of feeding points; and
a plurality of amplifiers inserted between said distributor and said discharge electrode to amplify the high-frequency power components distributed by said distributor.

49. An apparatus according to claim 47, wherein said high-frequency power-supply circuit comprises:
a plurality of high-frequency oscillators connected to said discharge electrode via a plurality of feeding points to independently oscillate high frequencies; and
an amplifier inserted between each of said plurality of high-frequency oscillators and said discharge electrode to amplify the oscillated frequency.

50. An apparatus according to claim 48, wherein said high-frequency power-supply circuit further comprises:
a plurality of impedance matching circuits inserted between said plurality of high-frequency oscillators and said discharge electrode to match the impedances of said plurality of high-frequency oscillators with the impedance of said discharge electrode; and
an isolator inserted between each impedance matching circuit and each high-frequency oscillator to reduce input high-frequency power from another high-frequency oscillator to said high-frequency oscillator in order to protect said high-frequency oscillator.

51. An apparatus according to claim 48, wherein said high-frequency power-supply circuit comprises a phase shifter inserted between said plurality of high-frequency oscillators and at least one amplifier to shift the phase of a high-frequency signal oscillated by said high-frequency oscillator.

52. An apparatus according to claim 47, wherein said high-frequency power-supply circuit comprises:
a plurality of high-frequency oscillators connected to said discharge electrode via a plurality of feeding points; and
a high-frequency mixer inserted between said plurality of high-frequency oscillators and said discharge electrode to mix high-frequency signals oscillated by said plurality of high-frequency oscillators.

53. An apparatus according to claim 52, further comprising an amplifier inserted between said high-frequency mixer and said discharge electrode to amplify the high-frequency signal mixed by said high-frequency mixer.

54. An apparatus according to claim 47, wherein said high-frequency power-supply circuit comprises an arbitrary waveform generator for oscillating a multiple high frequency having a plurality of frequency components such that the envelope distribution on said electrode changes each hour.

55. An apparatus according to claim 47, wherein
said discharge electrode has the shape of a ladder, mesh, rod, or rectangular plate, and
said high-frequency power-supply circuit comprises a plurality of feeding points disposed to be symmetrical with respect to a central line of said discharge electrode.

56. An apparatus according to claim 47, wherein
said discharge electrode has the shape of a circular plate, and
said high-frequency power-supply circuit comprises a plurality of feeding points disposed to be symmetrical with respect to a central point of said discharge electrode.

57. A semiconductor device fabrication apparatus comprising:
a chamber;
a substrate mounting table for holding a substrate in said chamber;
a discharge electrode opposed to said substrate on said substrate table in said chamber;
exhaust means for evacuating said chamber;
gas supply means for supplying a process gas into said chamber;
a high-frequency power-supply circuit for supplying high-frequency power to said discharge electrode; and
control means for controlling power supply from said high-frequency power-supply circuit to said discharge electrode such that an envelope representing the spatial distribution of a high-frequency voltage $\phi$ on said discharge electrode changes each hour in accordance with a function containing time as a parameter,
wherein said gas supply means supplies a film deposition gas into said chamber, and said control means controls the supply of high-frequency power from said high-frequency power-supply circuit to said discharge electrode, thereby generating a discharge plasma of the film deposition gas between said discharge electrode and said substrate, with substantially no standing wave of the high-frequency voltage $\phi$ generated on said discharge electrode.

58. A semiconductor device fabrication apparatus comprising:
a chamber;
a substrate mounting table for holding a substrate in said chamber;
a discharge electrode opposed to said substrate on said substrate table in said chamber;
exhaust means for evacuating said chamber;
gas supply means for supplying an etching gas into said chamber;
a high-frequency power-supply circuit for supplying high-frequency power to said discharge electrode; and
control means for controlling power supply from said high-frequency power-supply circuit to said discharge electrode such that an envelope representing the spatial distribution of a high-frequency voltage $\phi$ on said discharge electrode changes each hour in accordance with a function including time as a parameter,
wherein said gas supply means supplies an etching gas into said chamber, and said control means controls the supply of high-frequency power from said high-frequency power-supply circuit to said discharge electrode, thereby generating a discharge plasma of the etching gas between said discharge electrode and said substrate, with substantially no standing wave of the high-frequency voltage $\phi$ generated on said discharge electrode.

* * * * *